US006927426B2

(12) United States Patent
Matsuoka et al.

(10) Patent No.: US 6,927,426 B2
(45) Date of Patent: Aug. 9, 2005

(54) SEMICONDUCTOR LIGHT-EMITTING DEVICE FOR OPTICAL COMMUNICATIONS

(75) Inventors: Takashi Matsuoka, Kanagawa (JP); Hiroshi Okamoto, Kanagawa (JP)

(73) Assignee: Nippon Telegraph and Telephone Corporation, Tokyo (JP)

(*) Notice: Subject to any disclaimer, the term of this patent is extended or adjusted under 35 U.S.C. 154(b) by 0 days.

(21) Appl. No.: 10/426,464

(22) Filed: Apr. 30, 2003

(65) Prior Publication Data

US 2003/0234404 A1 Dec. 25, 2003

(30) Foreign Application Priority Data

| Jun. 19, 2002 | (JP) | 2002-178531 |
| Jun. 19, 2002 | (JP) | 2002-178536 |
| Aug. 30, 2002 | (JP) | 2002-252837 |

(51) Int. Cl.[7] .............................................. H01L 33/00
(52) U.S. Cl. ........................ 257/103; 257/89; 257/90; 257/96
(58) Field of Search ..................... 257/89, 90, 94, 257/96, 103, 88, 13, 14

(56) References Cited

U.S. PATENT DOCUMENTS

| 5,656,832 | A | 8/1997 | Hatano et al. | |
| 5,684,309 | A | 11/1997 | McIntosh et al. | |
| 5,696,389 | A | 12/1997 | Ishikawa et al. | |
| 5,780,873 | A | 7/1998 | Itaya et al. | |
| 5,798,537 | A | 8/1998 | Nitta | |
| 6,163,038 | A | 12/2000 | Chen et al. | |
| 6,266,355 | B1 | 7/2001 | Sverdlov | |
| 6,365,429 | B1 | 4/2002 | Kneissl et al. | |
| 6,563,139 | B2 * | 5/2003 | Hen | 257/89 |
| 6,623,998 | B2 * | 9/2003 | Shibata et al. | 438/22 |
| 2001/0038101 | A1 * | 11/2001 | Nemoto | 257/89 |
| 2001/0039066 | A1 | 11/2001 | Hoon | |
| 2002/0163005 | A1 * | 11/2002 | Kojima et al. | 257/80 |
| 2003/0047743 | A1 * | 3/2003 | Li | 257/96 |
| 2003/0116767 | A1 * | 6/2003 | Kneissl et al. | 257/79 |

FOREIGN PATENT DOCUMENTS

| EP | 1211736 A2 | 6/2002 |
| JP | 07183576 | 7/1995 |
| JP | 11243251 | 9/1999 |

OTHER PUBLICATIONS

Osamura et al., Solid State 11(1972) 617.
Puychevrier et al., Thin Solid Films, 36 (1976) 141.
Tansley et al., J. Appl. Phys., 59 (1986).
Matsuoka et al., "Wide–Gap Semiconduuctror (In, Ga) N", International Symposium on GaAs and Related Compounds, (Karuizawa, Japan, 1989) + in Inst. Phys. Conf. Ser., 106. pp. 141–146.
Matsuoka et al., "InN Epitaxial Growth by MOVPE", Extended Abstracts on the 36th Meeting of the Japan Society of Applied Physics and Related Societies, p 270 (1P–AN–10) (1989).
Matsuoka et al., "Optical Bandgap Energy of InN", Extended Abstracts on the 49th Meeting of the Japan Society of Applied Physics and Related Societies, p 392 (29p–ZM–1) (2002).

(Continued)

Primary Examiner—Minh-Loan Tran
(74) Attorney, Agent, or Firm—Blakely Sokoloff Taylor & Zafman

(57) ABSTRACT

A semiconductor light-emitting device of this invention includes at least a first cladding layer formed on a substrate, a light-emitting structure including an active layer made of $In_{1-X-Y}Ga_XAl_YN$ ($0 \leq X$, $Y \leq 1$, $0 \leq X+Y<1$) and formed on the first cladding layer, and a second cladding layer formed on the light-emitting structure. The active layer is made of a material with a small Auger effect and a small dependency of its band gap energy on environment temperature.

22 Claims, 12 Drawing Sheets

OTHER PUBLICATIONS

Matsuoka, "Phase Separation in Wurtzite In1-x-yGaxAlyN", MRS Internet J. Nitride Semicond. Res. 3, 54 (1998).

Guo et al., Jn. J. Appl. Phys., 33 (1994) 2453.

Ohki et al., "Continuous-wave operation of ZnSe-based laser diodes homoepitaxially grown on semi-insulation ZnSe substrates", Electronics Letters, 22$^{nd}$ May 1997, vol. 33, No. 1, pp. 990.

Ohno et al., "Room-temperature CW operation of II-VI lasers grown on ZnSe substrates cleaned with hydrogen plasma", Journal of Crystal Growth 184/185 (1998) pp. 550-553.

Ohno et al., "Surface cleaning with hydrogen plasma for low-defect-density ZnSe homoepitaxial growth", J. Vax. Sci. Technol. A 16(4), Jul./Aug. 1998, pp. 2539-2545.

Tachibana, K., et al., "MOCVD growth of a stacked InGaN quantum dot structure and its lasing oscillation at room temperature", PHYSICA E, vol. 7, No. 3, 2000, pp. 994-948

Arakawa, Y., et al., "GaN-Based Blue Kight Emitting VCSELs and Quantum Dot Lasers", IEEE, Jul. 26, 1999, pp. 75-76.

* cited by examiner

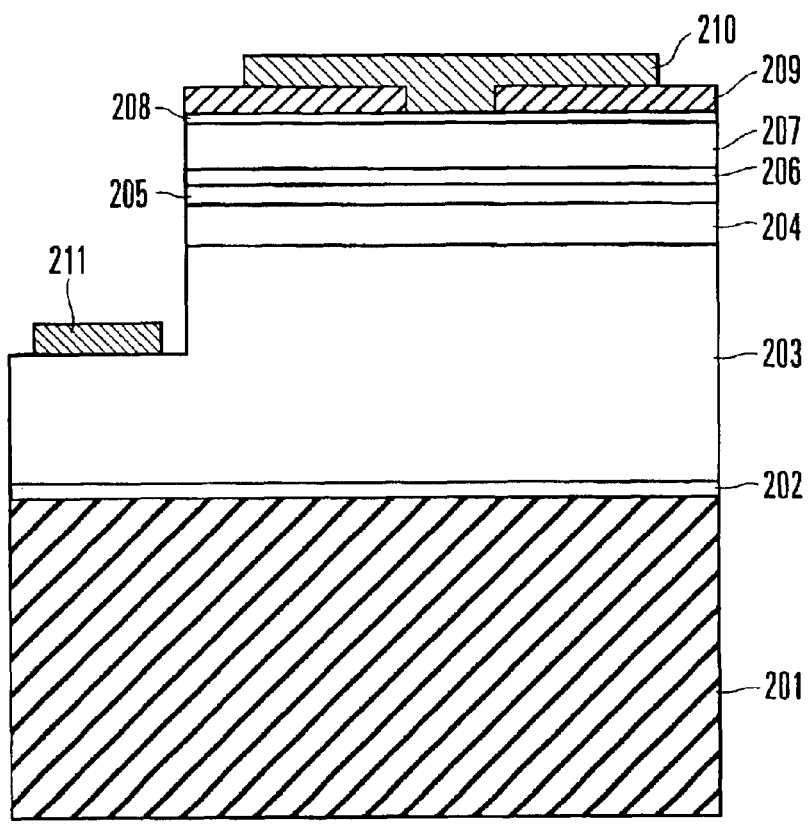
F I G. 8
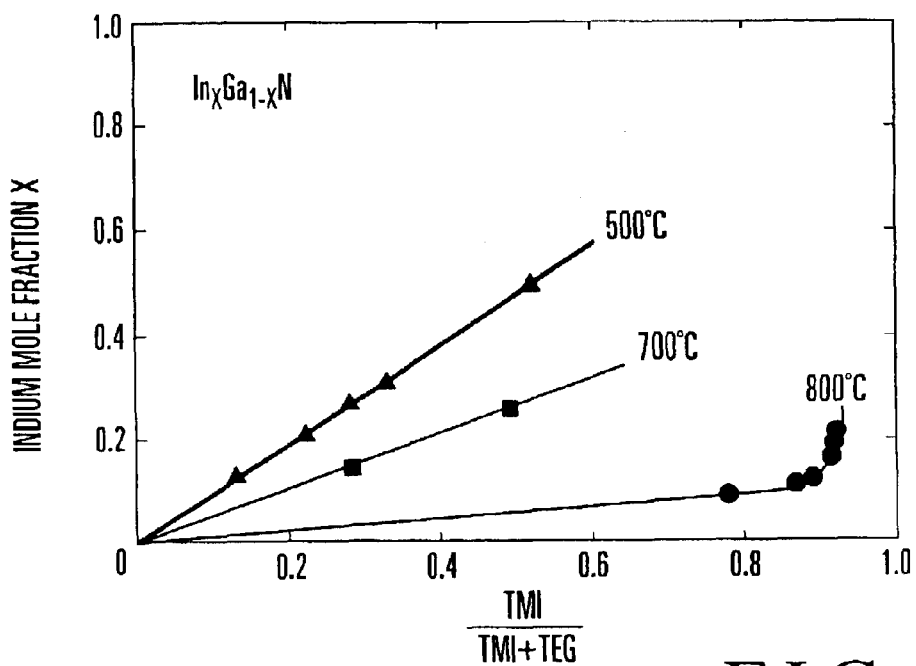
F I G. 9

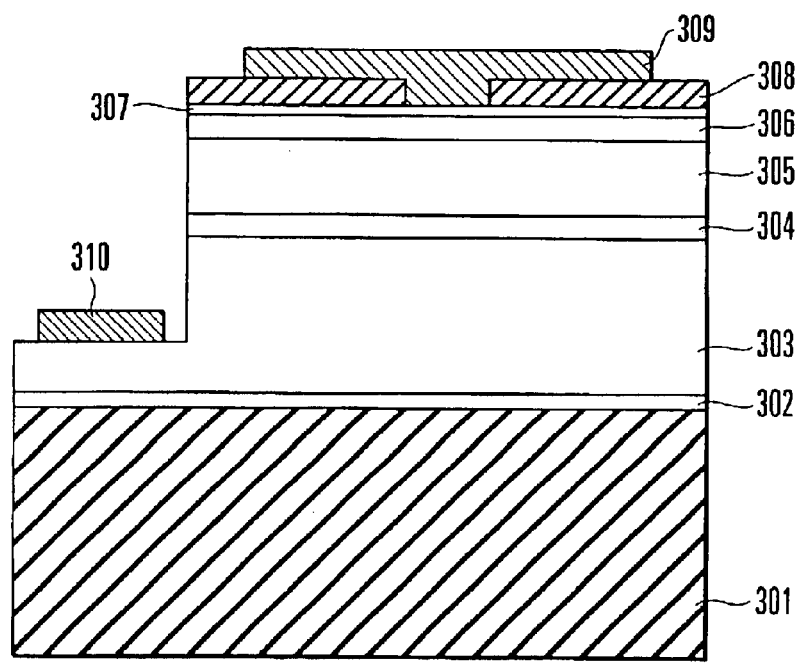
F I G. 10
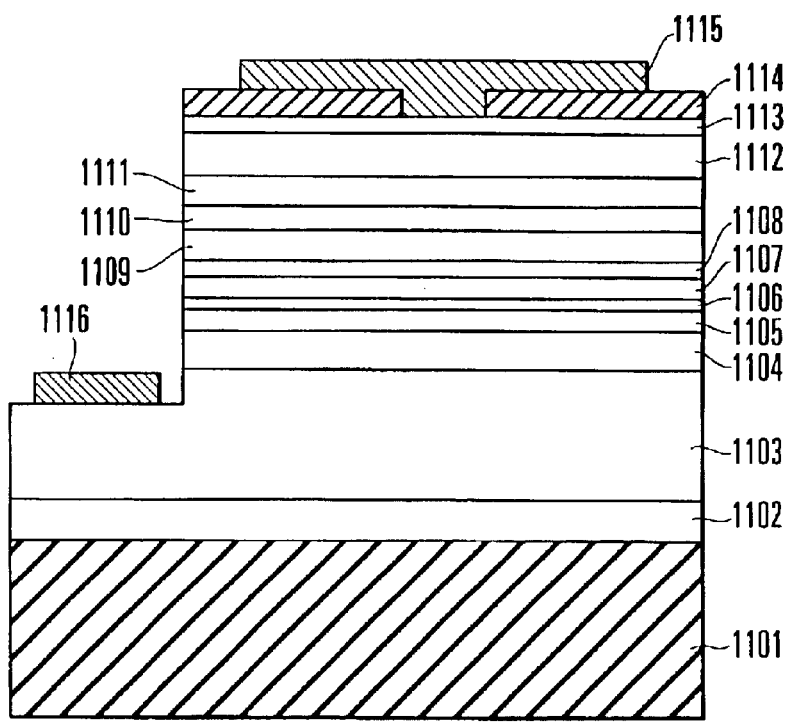
F I G. 11

SEMICONDUCTOR LIGHT-EMITTING DEVICE FOR OPTICAL COMMUNICATIONS

BACKGROUND OF THE INVENTION

The present invention relates to a semiconductor light-emitting device to be used for a light source in optical communication in the 1.3 to 1.5 µm wavelength band which uses a glass fiber as a transmission medium and a semiconductor light-emitting device as a light source in the visible region.

For example, currently, in general, in optical communication using a silica-based glass fiber as a transmission medium, the 1.3 to 1.5 µm wavelength band is mainly used. As a light source for such optical communication, a semiconductor laser formed from a crystal made of elements such as In, Ga, Al, As, and P is generally used. $In_XGa_{1-X}As_YP_{1-Y}$ ($0<X\leq1$, $0\leq Y<1$) (to be referred to as InGaAsP hereinafter), in particular, is often used for a semiconductor laser.

A conventional laser using an InGaAsP-based material has a problem that the characteristic temperature is as low as 40 to 60 K. This characteristic temperature is one of the important characteristics in practice. The relationship between a characteristic temperature $T_0$ and a threshold current $I_{th}$ is represented by $$I_{th}=I_0 exp(T/T_0)$$

where T is the operating environment temperature of the laser, and $I_0$ is the threshold current at zero absolute temperature. With low $T_0$, when the operating environment temperature rises, the threshold current for the semiconductor laser abruptly increases. In order to operate the semiconductor laser at constant power, the current injected into the semiconductor laser must be increased compared with that at a low operating temperature. With this increase in injection current, the temperature of the semiconductor laser further rises, in addition to a rise in operating environment temperature. As the operating environment temperature rises, the temperature of the semiconductor laser undergoes positive feedback. As a result, the device temperature greatly rises. In a laser formed from an InGaAsP-based material, the characteristic temperature is low for the following two reasons.

Reason 1

When a double-heterostructure, which is indispensable for the formation of a semiconductor laser, is formed, the discontinuity ($\Delta Ec$) in the conduction band in the energy band structure between a carrier confinement layer (cladding layer) and an active layer is small.

Reason 2

An InGaAsP-based material has a large Auger effect. With a large Auger effect, as the operating environment temperature rises, electrons in the conduction band in an active layer provide their energy to the lattice of crystal and cause non-radiative recombination with holes. A phenomenon similar to that of electrons occurs with respect to holes in the valence band. In a zinc-blende structure which is an InGaAsP-based crystal structure, since there is no energy difference between a heavy hole and a light hole in the valence band at the $\Gamma$ point in the band structure, i.e., there is no spin split-off energy $\Delta sp$, the Auger effect is large.

In a semiconductor laser, since the bandgap of the active layer decreases with a rise in device temperature, the emission wavelength lengthens. The following problems are caused by this wavelength change in optical communication.

First, in optical communication, the propagation speed of light in an optical fiber depends on the wavelength owing to the wavelength dispersion of the refractive index of the optical fiber. That is, the propagation speed of light in the fiber changes depending on a change in environment temperature. For this reason, as the environment temperature changes, on the transmitting side, the waveform of a pulse which has been rectangular with respect to the time axis distorts and spreads along with propagation of light. In long-distance communication, two optical pulses sent out from the transmitting side at different times overlap each other on the receiving side and cannot be discriminated from each other. In high bit-rate transmission system, since the intervals between optical pulses are small, two pulses sent out from the transmitting side at different times cannot be discriminated from each other on the receiving side due to changes in wavelength of optical pulses even in short-distance transmission. In addition, in wavelength division multiplexing communication (so-called WDM), since the intervals between operating wavelengths are as small as about 1 to 10 nm, variations in the wavelength of a light source cause cross-talk.

As described above, in optical communication, changes in the wavelength of communication light cause a serious problem, and great importance is attached to wavelength stability. For this reason, conventionally, a semiconductor laser serving as a light source is mounted on a Peltier device to perform temperature control so as to be used for actual optical communication. This makes it possible to stabilize operating temperature and ensure wavelength stability. Currently, therefore, in order to ensure the reliability of a communication system, great importance is also attached to the reliability of a temperature control means such as a Peltier device. The cost of equipping a Peltier device, the cost of a Peltier device control circuit, and the supply of power to the Peltier device increase the cost of a communication system. In addition, the presence of a Peltier device increases the number of components and causes a deterioration in the reliability of the overall communication system.

In addition, high power cannot be obtained from conventional optical communication light sources made of the materials described above. In optical communication systems, high-power light sources are required. Obviously, the higher the optical power of a light source, the longer the transmission distance. In large-capacity communication, since the pulse width of an optical signal is small, the energy of an optical pulse must be increased to realize communication with a high signal/noise ratio (S/N). In order to increase the energy of an optical pulse, a high-power light source is required.

The use of a conventional InGaAsP-based material will lead to a small band discontinuity $\Delta Ec$ in the conduction band in a double-heterostructure forming a semiconductor laser. For this reason, the injection of a large current easily causes a carrier overflow. The carrier overflow is a phenomenon in which carriers pass through a light-emitting layer without radiative recombination in the light-emitting layer. FIG. 19 shows a phenomenon in which electrons serving as carriers move from an n-type carrier confinement layer into a p-type carrier confinement layer through a light-emitting layer.

As described above, in a semiconductor laser using a conventional InGaAsP-based material, the injection of a large current does not increase optical power but only generates heat. In order to solve this problem, attempts have been made to use Al-included compound semiconductor for a p-type carrier confinement layer adjacent to a light-emitting layer. This slightly increases the band discontinuity in the conduction band and improves the characteristics of a semiconductor laser. However, the optical output of a semiconductor laser based on this technique is limited to the level of 100 mW in the 1.55-μm band.

In addition to the two problems described above, a conventional InGaAsP-based material has a problem that it is very difficult to realize a device for emitting light at a wavelength of 1.48 μm at which the highest excitation efficiency can be obtained in an optical fiber amplifier in the 1.55-μm band. This is because the composition of a crystal that emits light in the 1.55-μm wavelength band exists in a thermodynamically immiscible region in the InGaAsP system. In order to acquire a crystal in an immiscible region, crystal growth must be done under a thermodynamically nonequilibrium condition. Even if a crystal in an immiscible region is obtained under a thermal nonequilibrium condition, its crystallinity is worse than that of a crystal grown under a thermal equilibrium condition. Although devices have been manufactured by using such crystals, they exhibit low optical power and low luminous efficiency, and the device lifetimes are short.

Problems in conventional light-emitting devices in the visible region will be described next. The first problem is that light-emitting diodes (to be referred to as LEDs hereinafter) for emitting blue, green, and yellow light beams and the like shorter in wavelength than a wavelength of 670 nm exhibit poor characteristics. Blue and green LEDs have been manufactured by using quantum well structures having well layers made of InGaN, and available on the market. It is, however, confirmed that phase separation occurs in well layers made of InGaN which are used for these devices. More specifically, regions (dots) with high In compositions are scattered in InGaN with a uniform In composition. Since these dots differ in size, the resultant light emission has a large spectrum width.

The second problem in the conventional light-emitting devices in the visible region is that no high-quality yellow LED has been obtained. For example, yellow LEDs have already been used for the yellow lights in some traffic signals mainly in the US. InGaAlP is used as a material for these devices. In a yellow light-emitting device using InGaAlP, however, the band discontinuity in the conduction band in the heterostructure made of InGaAlP materials with different compositions is small. For this reason, as described in association with the optical communication light sources, the efficiency of conversion from an injected current into light is low. In addition, an ineffective current in terms of light emission, generates heat, and hence the characteristics of the device degrade by this heat.

In order to solve this problem, attempts are made to manufacture yellow LEDs by using InGaN. However, light emission produced by an yellow LED using InGaN is one order of magnitude or more lower in intensity than blue and green light emissions. This is because in the yellow region, strong phase separation of InGaN occurs to result in poor crystallinity.

Another conventional problem in a light-emitting device in the visible region is that no practical semiconductor laser has been realized. Although LEDs can be manufactured in a wavelength range from blue to orange, no laser structure has been manufactured. This is because no device structure designed to oscillate at a low threshold current can be formed by using any conventional semiconductor materials. Only devices in a wavelength range longer than 630 nm have been manufactured.

Lasers in the 630-nm wavelength range have been manufactured by using InGaAlP-based materials. However, since the discontinuity ΔEc in the conduction band between a light-emitting layer and a cladding layer (carrier confinement layer) is small, an electron overflow is prevented by using an electron reflector based on electron wave interference which is formed from a multi-quantum well called a multi-quantum-barrier (commonly called an MQB) for a p-type cladding layer. The use of an MQB, however, leads to a high driving voltage for the device because of the presence of many band discontinuities in the conduction band.

In addition, the number of multi-quantum well layers in an active layer is one to three in general, whereas about several ten multi-quantum well layers are required in an MQB. The precision of the thickness of each quantum well layer in an active layer corresponds to the precision associated with the wavelength of light in the multi-quantum well. In contrast to this, in an MQB, this precision corresponds to the precision associated with an electron wave shorter in wavelength than light, and hence stricter thickness precision is required. In practice, the precision of the thickness of a quantum well layer is about 1/10 nm. As described above, according to the above conventional devices, an MQB is difficult to manufacture compared with a multi-quantum well serving as an active layer of a light-emitting device.

SUMMARY OF THE INVENTION

It is, therefore, a principal object of the present invention to provide an inexpensive semiconductor light-emitting device which is robust against changes in temperature in an operating environment and can perform high-power operation. It is another object of the present invention to provide a semiconductor laser which emits light in a wavelength range from blue to orange.

In order to achieve the above objects, according to an aspect of the present invention, there is provided a semiconductor light-emitting device includes at least a first cladding layer formed on a substrate, a light-emitting structure including an active layer made of $In_{1-X-Y}Ga_XAl_YN$ ($0 \leq X$, $Y \leq 1$, $0 \leq X+Y < 1$) and formed on the first cladding layer, and a second cladding layer formed on the light-emitting structure.

With this arrangement, the active layer is made of a material with a small Auger effect. In addition, the active layer is made of a material having a uniform composition without any phase separation. Furthermore, an arrangement can be realized, in which the band discontinuity ΔEc in the conduction band between the active layer and the p-type cladding layer can be set to be large.

BRIEF DESCRIPTION OF THE DRAWINGS

FIG. 8 is a sectional view schematically showing an example of the arrangement of a semiconductor light-emitting device according to another embodiment of the present invention;

FIG. 9 is a graph showing the relationship between the In composition of a solid phase in the growth of InGaN and the ratio of the supply amount of TMI to the total supply amount of Group III source;

FIG. 10 is a sectional view schematically showing an example of the arrangement of a semiconductor light-emitting device according to still another embodiment of the present invention;

FIG. 11 is a sectional view schematically showing an example of the arrangement of a semiconductor light-emitting device according to still another embodiment of the present invention;

DESCRIPTION OF THE PREFERRED EMBODIMENTS

The embodiments of the present invention will be described in detail below with reference to the accompanying drawings.

[First Embodiment]

Figure 1A:
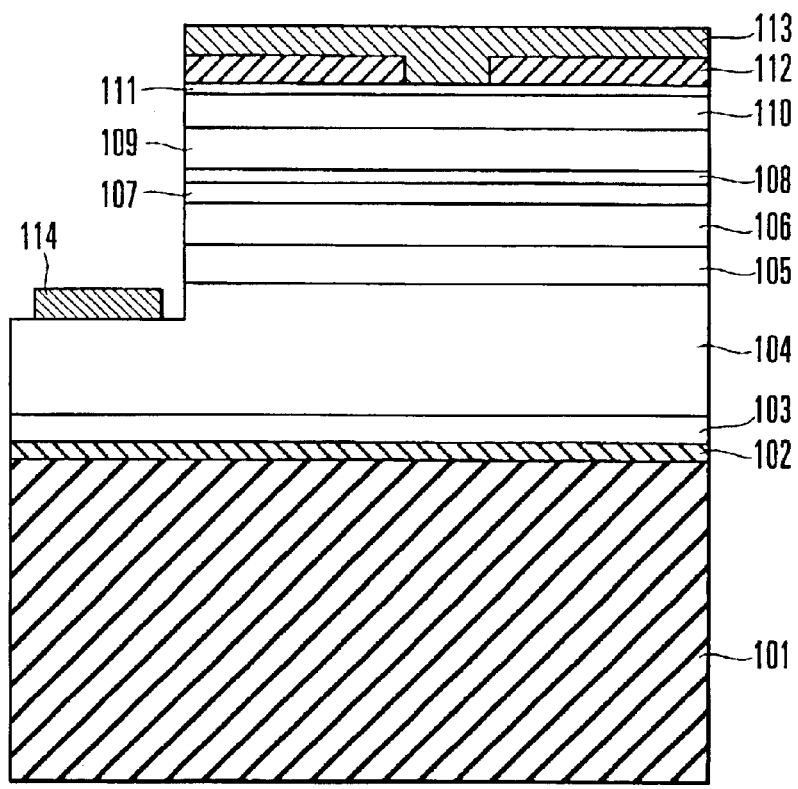
FIG. 1A is a sectional view schematically showing an example of the arrangement of a semiconductor light-emitting device according to the first embodiment of the present invention.
Figure 1B:
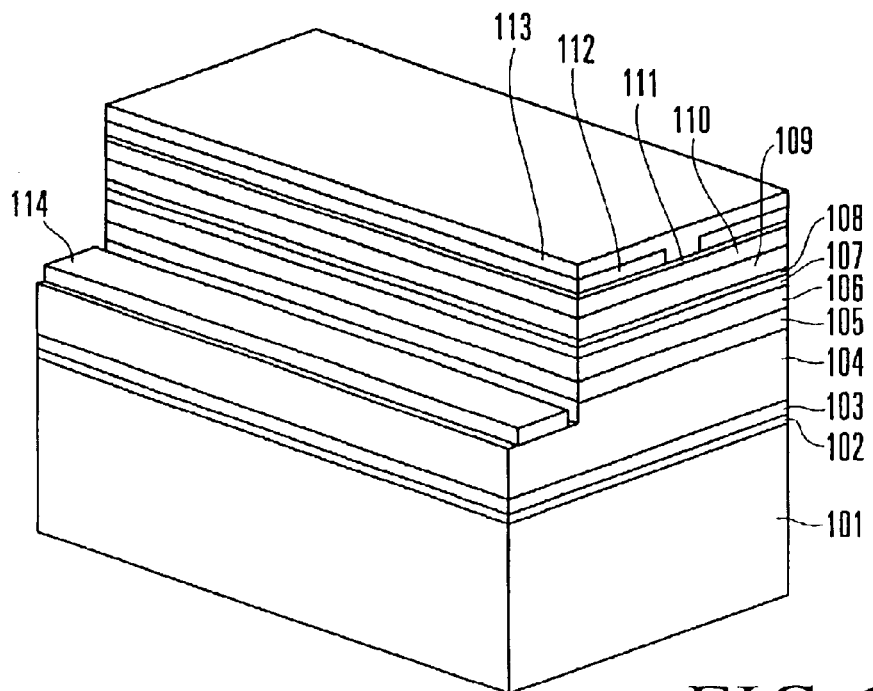
FIG. 1B is a perspective view schematically showing an example of the arrangement of the semiconductor light-emitting device according to the first embodiment of the present invention.

FIG. 1A shows an example of the arrangement of a semiconductor light-emitting device according to an embodiment of the present invention. FIG. 1B shows a cross-sectional view of a semiconductor laser with an oscillation wavelength of 0.4 μm or more, as an example, in a direction in which guided light propagates back and forth in the cavity, i.e., along a direction perpendicular to the axis of the cavity.

This semiconductor laser has a 20-nm thick buffer layer 103 made of GaN formed on the upper surface of a 330-μm thick single-crystal substrate 101 made of (0001)-oriented sapphire (single-crystal $Al_2O_3$) through a nitride layer 102 with a nitridation depth of 1.2 nm, a 4-μm thick electrode layer 104 made of Si-doped n-type GaN, and a 0.5-μm thick cladding layer 105 made of Si-doped n-type $Al_{0.1}Ga_{0.9}N$. Note that the single-crystal substrate 101 is not limited to sapphire. For example, this substrate may be made of a crystal such as silicon carbide (SiC), zinc oxide (ZnO), or lithium gallate ($LiGaO_2$).

In addition, on the cladding layer 105, the following layers are formed: a 0.6-μm thick guiding layer 106 made of Si-doped n-type GaN, a 20-nm thick active layer 107 made of InN, a 10-nm thick growth cover layer 108 made of undoped GaN, a 0.55-μm thick guiding layer 109 made of Mg-doped p-type GaN, a 0.5-μm thick cladding layer 110 made of Mg-doped p-type $Al_{0.1}Ga_{0.9}N$, and a 0.1-μm thick contact layer 111 made of Mg-doped p-type GaN.

A current limiting insulating layer 112 which is made of $SiO_2$ and has a groove with a width of about 2 μm to limit a current injection region is formed on the contact layer 111. Note that the above groove is formed parallel to the propagating direction of light in the cavity of this semiconductor laser. A p-type metal electrode 113 which is in contact with the contact layer 111 through the above groove is formed on the current limiting insulating layer 112. Although not shown, the p-type metal electrode 113 has a multilayer structure constituted by a 50-nm thick palladium layer in direct contact with the contact layer 111, a 30-nm thick platinum layer formed on the palladium layer, and a 200-nm thick gold layer formed on the platinum layer.

Note that the electrode layer 104 has an exposed region formed by partly etching the respective layers formed thereon, and an n-type metal electrode 114 in this exposed region. Although not shown, the n-type metal electrode 114 has a multilayer structure constituted by a 50-nm thick titanium layer in direct contact with the exposed region, a 30-nm thick platinum layer, and a 200-nm thick gold layer. The cavity length of the semiconductor laser shown in FIG. 1 is about 500 μm.

Figure 2:
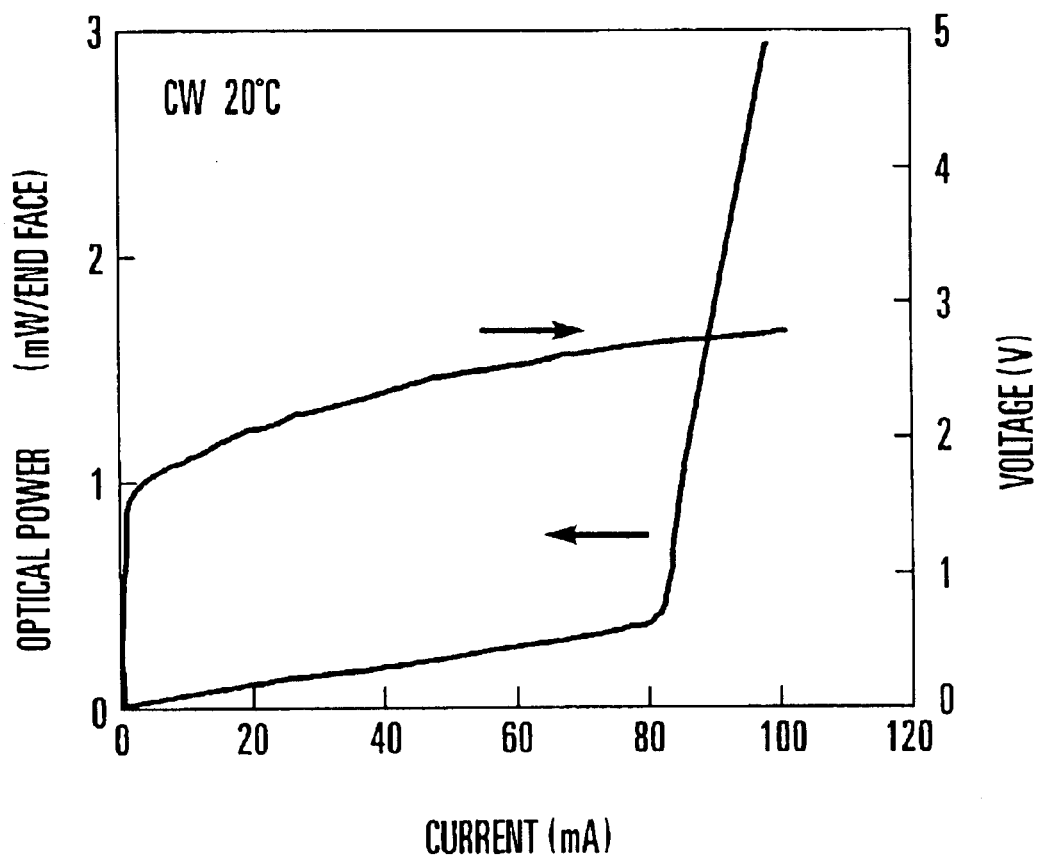
FIG. 2 is a graph showing the characteristics of the semiconductor light-emitting device according to the first embodiment of the present invention.

FIG. 2 shows an optical power/current characteristic (CW characteristic) and voltage/current characteristic obtained as results of measuring the semiconductor laser in FIGS. 1A and 1B, mounted junction up on a heat sink, at room temperature by using a DC current. The semiconductor laser shown in FIGS. 1A and 1B caused CW oscillation at room temperature with a threshold current of 82 mA. The resultant oscillation wavelength was 1.60 μm. The operating voltage at this time was 2.8 V. A built-in voltage $V_b$ was about, 1.2 V.

When $In_{1-X}Ga_XN$ (0<X<0.4) is used for a light-emitting structure including an active layer as in the prior art, the built-in voltage $V_b$ is a little less than 4 V. Note that the semiconductor laser in FIGS. 1A and 1B exemplifies the laser using InN for the active layer 107. However, $In_{1-X-Y}Ga_XAl_YN$ (0≦X, Y≦1, 0≦X+Y<1) having a larger bandgap than InN may be used for an active layer. In this case, the oscillation wavelength can be further decreased to, for example, 0.4 μm.

InGaAlN ($In_{1-X-Y}Ga_XAl_YN$ (0≦X, Y≦1, 0≦X+Y≦1) will be described below.

Conventionally, there has been no idea of applying InGaAlN materials to semiconductor light-emitting devices (semiconductor lasers) with wavelengths of 1.3 μm to 1.58 μm which fall in the optical communication wavelength range or semiconductor light-emitting devices designed to obtain light in a wavelength range longer than the wavelength of orange light. This was because the bandgap energy (Eg) of InN, which has the smallest Eg among these materials, was 1.9 to 2.1 eV. In the times when such Eg was measured, InN was formed by reactive sputtering or the like, and only polycrystalline InN could be formed. That is, the above bandgap measurement result was obtained from polycrystalline InN (reference 1: K. Osamura, K. Nakajima and Y. Murakami, Solid State Comm., 11 (1972) 617, reference 2: N. Puychevrier and M. Menoret, Thin Solid Films, 36 (1976) 141, and reference 3: T. L. Tansley and C. P. Foley, J. Appl. Phys., 59 (1986)).

Of compounds AlN, GaN, and InN constituting InGaAlN, the equilibrium vapor pressure of nitrogen on the solid phase of InN is five orders of magnitude higher than those of the remaining compounds (reference 4: T. Matsuoka, H. Tanaka, T. Sasaki and A. Katsui, "Wide-Gap Semiconductor (In, Ga) N", International Symposium on GaAs and Related Compounds, (Karuizawa, Japan, 1989); in Inst. Phys. Conf. Ser., 106. pp. 141–146). It is almost impossible to form a high-quality crystal using InN having such characteristics by a method like reactive sputtering in which the pressure in a vessel used for the formation of a film cannot be increased. In the above times, since attempts were also made to form an InN film on a glass substrate, no lattice information about single-crystal growth could be obtained, and no single crystal could be grown.

Under the circumstances, the present inventors tried to grow single-crystal InN on a single-crystal sapphire substrate by using metalorganic vapor phase epitaxy (to be referred to as MOVPE hereinafter) in which a nitrogen pressure can be applied, and achieved the world's first success in single-crystal growth in 1989. The present inventors reported this result at an academic conference in 1989 (reference 5: Takashi Matsuoka, Toru Sasaki, Hirotsugu Sato, and Akinori Katsui, "InN EPITAXIAL GROWTH by MOVPE", Extended Abstracts on the 36th Meeting of the Japan Society of Applied Physics and Related Societies, p. 270 (1p-ZN-10) (1989)).

The crystallinity of the single crystal obtained at this time, however, was insufficient, and hence this technique fell short of obtaining the optical characteristics of InN. The present inventors made various technical improvements afterward, and achieved the world's first success in growing high-quality single-crystal InN whose optical characteristics could be measured in 2001 (reference 6: Takashi Matusoka, Masahi Nakao, Hiroshi Okamoto, Hiroshi Harima, Eiji Kurimoto, and Megumi Hagiwara, "OPTICAL BANDGAP ENERGY of InN", Extended Abstracts on the 49th Meeting of the Japan Society of Applied Physics and Related Societies, p. 392(29p-ZM-1) (2002); the deadline for a manuscript in the Society of Applied Physics: Jan. 8, 2002; the meeting: from 27 to 30 March; and the announcement date: March 29).

The first technical improvement to grow the above high-quality single-crystal InN was to form in advance GaN having an intermediate lattice constant between those of sapphire and InN on a sapphire substrate. In this case, a GaN layer is required to have high crystallinity. For this reason, the growth conditions for GaN were optimized in the following points:

1. cleaning of the surface of a sapphire substrate in the reactor;
2. nitridation of the sapphire surface with ammonia;
3. low-temperature growth of GaN as a buffer layer to reduce lattice-mismatch between sapphire and GaN;
4. high-temperature annealing to form the above buffer layer into a single crystal; and
5. high-temperature growth of high-quality GaN.

The second technical improvement was to examine the growth conditions for InN on GaN grown under the conditions optimized in the above manner. The items examined were a growth temperature, a growth rate, the ratio of a Group V source to an In source, a gas flow rate in the reactor, and the like. As a result of the examination on these items, the present inventors made the first success in growing InN whose optical characteristics could be measured. At present, an InN layer can be directly formed on a sapphire layer without forming any GaN layer therebetween.

Figure 3:
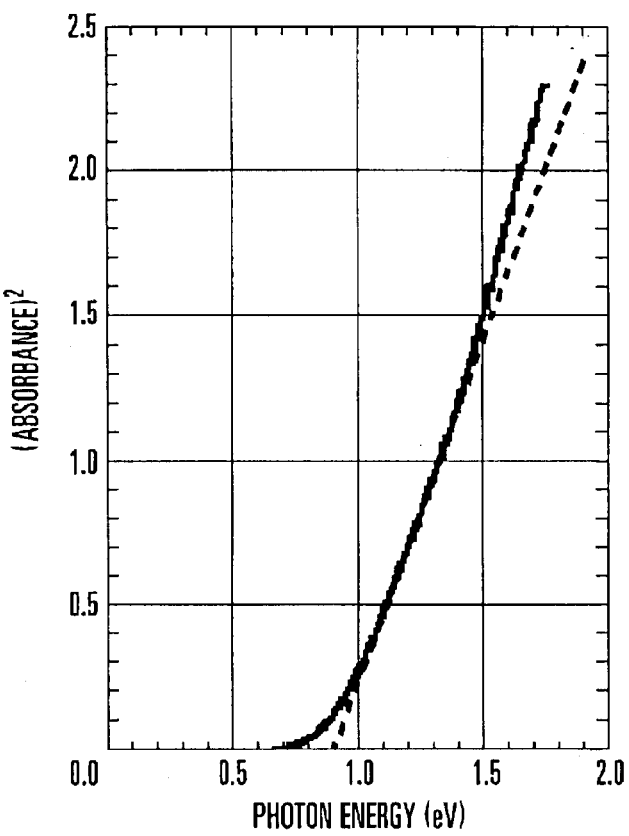
FIG. 3 is a graph showing the relationship between absorbance squared and photon energy in an InN film grown under the condition that V/III is set to 660,000.
Figure 4:
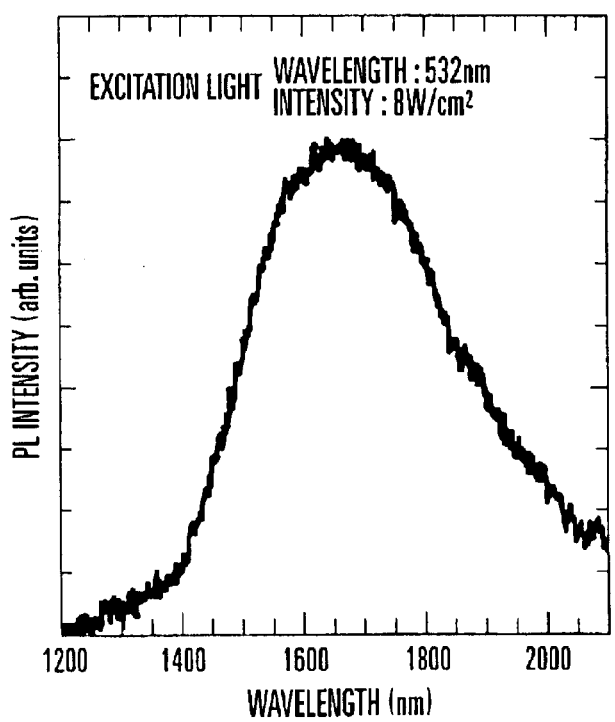
FIG. 4 is a graph showing the photoluminescence measured at room temperature from the InN film grown under the condition that V/III is set to 660,000.

FIGS. 3 and 4 show the characteristics of a formed InN film. FIG. 3 shows the relationship between absorbance squared and photon energy in the formed film. As shown in FIG. 3, in the formed InN film, a clear absorption edge is detected from optical absorbance. Since this relationship is almost linear, InN can be regarded as a linear transition type, and the Eg can be estimated as about 0.8 eV.

FIG. 4 shows the photoluminescence measured at room temperature from the InN film formed under the above conditions. It is obvious that light emission occurred near a wavelength of 1.65 μm (0.75 eV). Both the measurement results of absorbance and photoluminescence shown in FIGS. 3 and 4 indicate that the Eg of the InN film formed under the above condition is 0.8 eV. From these results, it can be estimated that the Eg of InN is near 0.8 eV.

Figure 5:
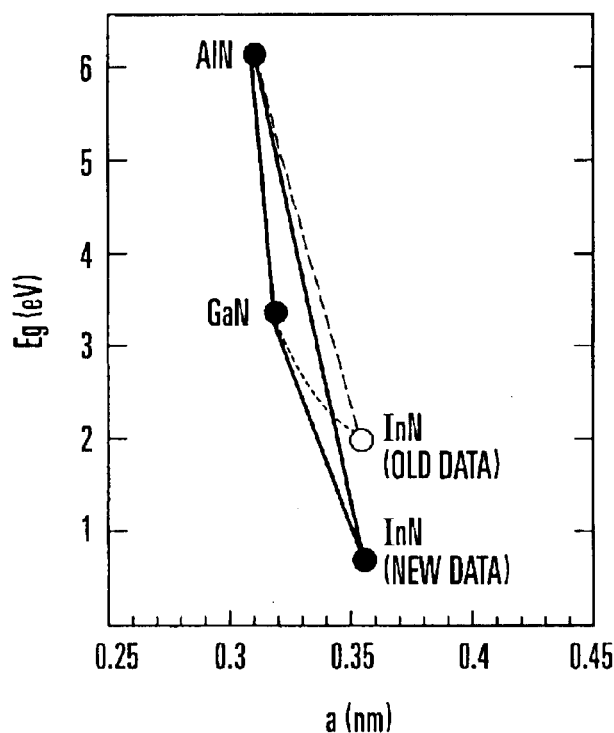
FIG. 5 is a graph showing the relationship between the Eg of $In_{1-X-Y}Ga_XAl_YN$ ($0 \leq X, Y \leq 1$, $0 \leq X+Y \leq 1$) and a lattice constant a of the a-axis.

The above various technical improvements and longtime efforts have revealed for the first time that the Eg of single-crystal InN is 0.8 eV which is ½ or less of the measurement results in the past. FIG. 5 shows the relationship between the Eg of InGaAlN and a lattice constant a of the a-axis. The broken lines represent the conventional data, and the solid lines represent the result in which the data (Eg=0.8 eV) obtained by the present inventors is reflected.

As is obvious from the above description, a high-power, high-$T_0$ semiconductor light-emitting device can be manufactured by forming a double-heterostructure or quantum well structure using $In_{1-X-Y}Ga_XAl_YN$ (0≦X, Y≦1, 0≦X+Y<1). For example, $T_0$, which was about 60 K in the prior art, can be increased to about 150 K. In addition, as a device designed to emit light with a wavelength of 1.48 μm, which had a difficulty in crystal growth using a conventional material, a device having good characteristics can be manufactured because a material can be easily grown under a thermal equilibrium condition. Furthermore, as light-emitting devices such as lasers and LEDs for emitting light in the yellow, blue, and green regions, devices having good characteristics can be manufactured.

As compared with InGaAsP, InGaAlN exhibits high spin split-off energy Δsp at the Γ point in the valence band. For this reason, the Auger effect of InGaAlN is small, so the temperature characteristic of the light-emitting device improves. When a heterostructure is formed by using InGaAlN, a band discontinuity ΔEc in the valence band becomes large. For this reason, the overflow of carriers can be reduced. As a consequence, in a light-emitting device using InGaAlN, heat generation is suppressed, and the temperature characteristic improves.

When the thicknesses of a well layer (active layer) of a quantum well structure and barrier layer are controlled by using pure InN for the well layer and a composition other than InN, e.g., $In_{1-X-Y}Ga_XAl_YN$ ($0 \leq X$, $Y \leq 1$, $0 < X+Y < 1$), for the barrier layer, a semiconductor light-emitting device designed to emit light at a wavelength of 1.48 μm, which is difficult to manufacture with a high-quality crystal by using an InGaAsP-based material, can be manufactured. Obviously, even if $In_{1-X-Y}Ga_XAl_YN$ ($0 \leq X$, $Y \leq 1$, $0 < X+Y < 1$) is used for the active layer instead of pure InN, a semiconductor light-emitting device designed to emit light at 1.48 μm can also be manufactured.

Figure 6:
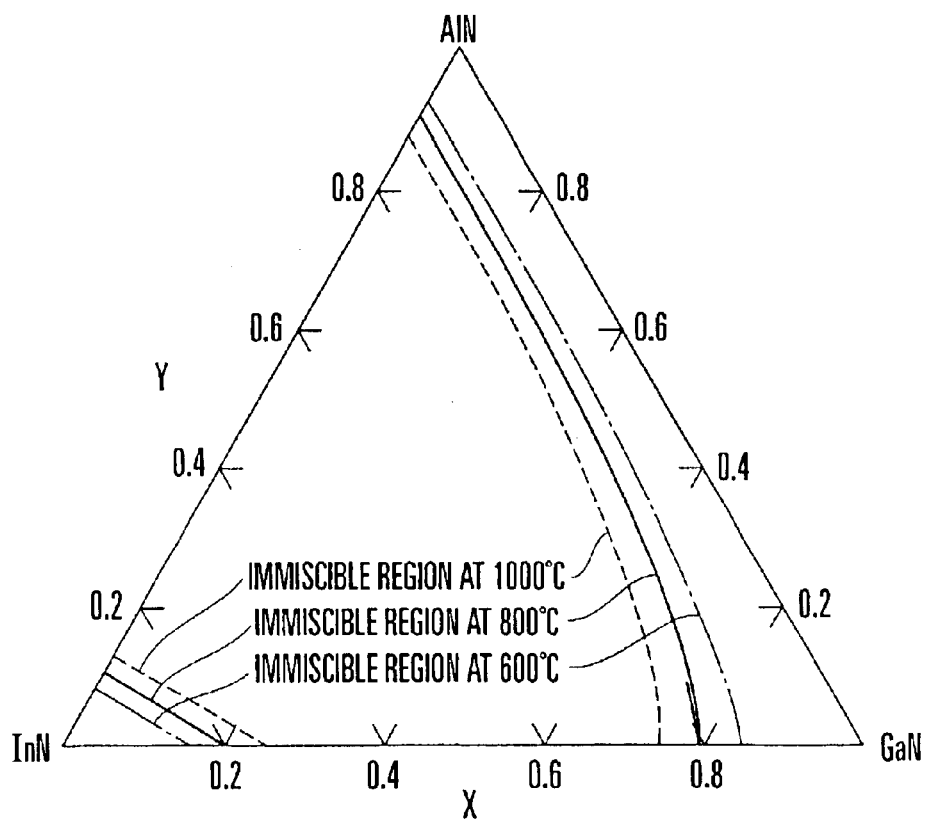
FIG. 6 is a graph showing the immiscible regions of $In_{1-X-Y}Ga_XAl_YN$ ($0 \leq X, Y \leq 1$, $0 \leq X+Y \leq 1$) which are obtained from experiments and calculations.

FIG. 6 shows the immiscible regions of InGaAlN which are obtained from experiments and calculations (reference 7: T. Matsuoka, "Phase Separation in Wurtzite $In_{1-X-Y}Ga_XAl_YN$", MRS Internet J. Nitride Semicond. Res. 3, 54 (1998)). Referring to FIG. 6, the chain lines indicate the immiscible region of InGaAlN when it grows at 600° C.; the solid lines, the immiscible region of InGaAlN when it grows at 800° C.; and the broken lines, the immiscible region of InGaAlN when it grows at 1,000° C. The regions inside the respective lines are the immiscible regions.

As shown in FIG. 6, some composition regions cannot grow under a thermal equilibrium condition. With a composition indicated in a miscible region outside the immiscible regions, the semiconductor light-emitting device shown in FIGS. 1A and 1B can be formed under the thermal equilibrium condition by controlling the composition and thickness of a quantum well structure. With regard to a light-emitting device in the visible region as well, a crystal layer that forms the structure of a light-emitting layer including an active layer can be grown under the thermal equilibrium condition, and a large band discontinuity can be set in the conduction band. Therefore, a light-emitting device having good characteristics can be manufactured.

According to this embodiment, therefore, a light-emitting device which operates with high power and high reliability near 1.48 μm can be provided as, for example, an excitation light source for a fiber amplifier. As a consequence, the output power of the fiber amplifier increases, and the transmission distance of optical communication increases. In addition, the application of the structure shown in FIGS. 1A and 1B to the wavelength region of 1.55-μm will realize high power/high $T_0$ and hence a long-haul and high-bit-rate transmission system.

In addition, LEDs or semiconductor lasers in the visible region can be provided, which are much higher in luminous efficiency than conventional devices and have longer device lifetimes.

Furthermore, the semiconductor light-emitting device using InN according to this embodiment improves in stability with respect to environmental temperatures, as will be described next. If a change in the bandgap energy (Eg) of a semiconductor material with temperature is defined as "{Eg(300)−Eg(0)}/Eg(0)", InAs exhibits a change of 0.12, and GaAs exhibits a change of 0.57. InP exhibits a change of 0.48. In this case, Eg(300) represents an Eg at 300 K, and Eg(0) represents an Eg at 0 K. Such a description is made in reference 8 (Q. Guo and A. Yoshida, Jn. J. Appl. Phys., 34 (1995) 4653)).

When the present inventors measured a change in the Eg of InN with temperature, the measured value became much smaller than the above mentioned values. This finding obtained by the present inventors differs from the contents concerning InN disclosed in reference 8. InP which is currently used as a main material for a semiconductor light-emitting device for optical communication emits light with a wavelength of 925 nm at 300 K, and emits light with a wavelength of 919 nm at 280 K. As described above, in a semiconductor light-emitting device using InP, as the temperature changes by 20° C., the wavelength shifts by as much as 6 nm.

In contrast to this, in a semiconductor light-emitting device using InN, even if the temperature changes by 20° C., almost no wavelength shift is observed. As described above, a semiconductor light-emitting device using InN hardly exhibits a wavelength change with respect to a change in environmental temperature. For this reason, if, for example, a semiconductor light-emitting device using InN is applied to a communication system, the stability of the communication system can be greatly improved.

A method of manufacturing the semiconductor light-emitting device shown in FIGS. 1A and 1B will be described next. An equipment of metalorganic vapor phase epitaxy having a vertical-type reactor is used for crystal growth for the formation of each crystal layer. As a nitrogen source, ammonia is used. As a carrier gas, nitrogen gas is used for the growth of a layer containing In, and hydrogen gas is used for the growth of a layer containing no In. Atmospheric pressure is held in the reactor during growth.

First of all, the substrate temperature is set at 1,050° C., and the surface of the single-crystal substrate 101 made of sapphire is nitrided in an ammonia atmosphere to form the nitride layer 102. Thereafter, the substrate temperature is set at 550° C., and the buffer layer 103 is formed by growing GaN. In the growth of this GaN, trimethylgallium (TMG) can be used as an organic metal serving as a gallium source, in addition to triethylgallium (TEG). Merits of TEG over TMG are that TEG has a low vapor pressure, is suited to supply of a small amount of Ga, readily decomposes at a low temperature of 550° C., and allows no carbon which is a constituent element of the source to be taken in the grown layer.

Subsequently, the single-crystal substrate 101 is annealed at 1,050° C. for 9 min to form the buffer layer 103 into a single crystal. The temperature of the single-crystal substrate is then set at 1,020° C., and Si-doped n-type GaN, Si-doped n-type $Al_{0.1}Ga_{0.9}N$, and Si-doped GaN are sequentially grown to form the electrode layer 104, cladding layer 105, and guiding layer 106. As an aluminum source for the vapor phase growth of these layers, trimethylaluminum (TMA) is used. As a gallium source, trimethylgallium (TMG) is used, which is relatively high in vapor pressure and suitable for the supply of a large amount of source. Silane ($SiH_4$) gas which is diluted with hydrogen and has a concentration of 1 ppm is used to dope each layer with Si. Note that the same source is used for Si doping in the process of growing each layer (to be described later).

InN is then grown on the guiding layer 106 to form the active layer 107. In the growth of InN, since the nitrogen equilibrium vapor pressure of InN between a solid phase and a gas phase is high, the substrate temperature is set at 500° C. In this growth process, in order to grow high-quality InN by preventing precipitation of metal In, the ratio of ammonia to TMI, i.e., V/TMI (V/III), is set to 660,000.

Figure 7C:
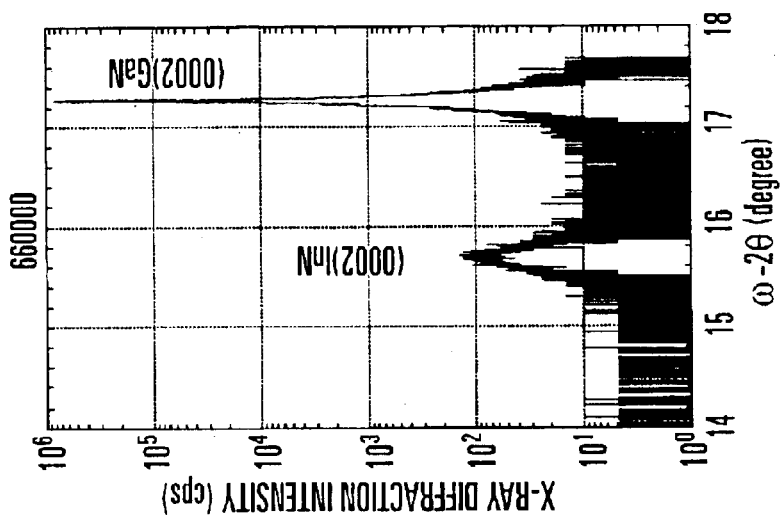
FIG. 7C is a graph showing the X-ray diffraction spectrum of InN grown while the ratio V/TMI of the amount of ammonia as a nitrogen source to the amount of trimethylindium (TMI) as an indium source is set to 660,000.
Figure 7B:
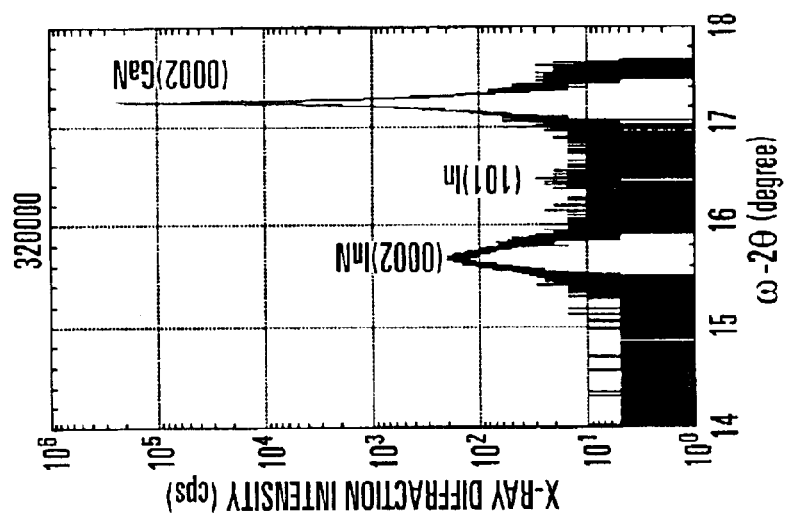
FIG. 7B is a graph showing the X-ray diffraction spectrum of InN grown while a ratio V/TMI of the amount of ammonia as a nitrogen source to the amount of trimethylindium (TMI) as an indium source is set to 320,000.
Figure 7A:
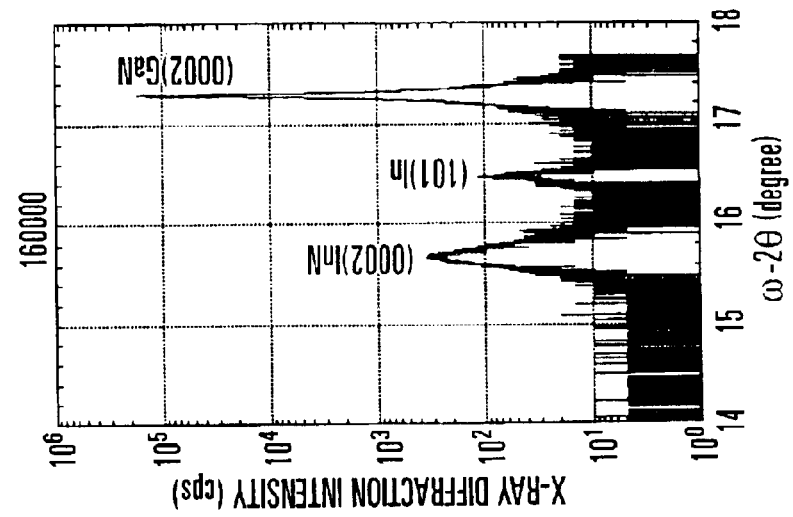
FIG. 7A is a graph showing the X-ray diffraction spectrum of InN grown while a ratio V/TMIIn of the amount of ammonia as a nitrogen source to the amount of trimethylindium (TMI) as an indium source is set to 160,000.

FIGS. 7A, 7B, and 7C show, as an example of the relationship between growth conditions for InN and crystallinity, the X-ray diffraction spectra of InN grown while a ratio V/TMI of the amount of ammonia as a nitrogen source supplied to the reactor to the amount of trimethylindium (TMI) as an indium source supplied to the reactor is changed. FIGS. 7a, 7B, and 7C show ω-2 θ scan spectra. As shown in FIGS. 7A and 7B, in the films grown under the conditions that V/III is set to 160,000 or less and to 320,000, signals from metal indium are observed. In contrast to this, in the film grown under the condition that V/III is set to 660,000 as shown in FIG. 7C, the peak of metal indium disappears, and hence it is known that no metal indium is contained.

Nitrogen is used both as a TMI carrier gas and a bubbling gas. This is because the use of hydrogen as these gases will suppress the decomposition of ammonia and decreases the effective V/III ratio, resulting in inhibition of the growth of InN (reference 5).

GaN is grown at 500° C., which is the same growth temperature for InN, by using a nitrogen carrier gas to suppress etching to the active layer 107 and a deterioration in its crystallinity, thereby forming the growth cover layer 108. After the growth cover layer 108 is formed, the substrate temperature is raised to 1,020° C. to improve the quality of the growth cover layer 108. Subsequently, Mg-doped p-type GaN, Mg-doped p-type $Al_{0.1}Ga_{0.9}N$, and Mg-doped p-type GaN are sequentially grown to form the guiding layer 109, cladding layer 110, and contact layer 111.

As a source for Mg doping, bis(methylcyclopentadienyl) magnesium is used. This source is a liquid, which is advantageous in controllability and reproducibility of the doping concentration of Mg over bis(cyclopentadienyl)magnesium which is a generally used solid source.

After the guiding layer 109, cladding layer 110, and contact layer 111 are formed, the resultant structure is annealed in a nitrogen atmosphere at 700° C. for 30 min to activate Mg added to these layers.

After the respective crystal layers described above are formed, the current limiting insulating layer 112 made of $SiO_2$ is formed on the contact layer 111 by using an RF magnetron sputter apparatus, and a groove is formed in the current limiting insulating layer 112 by the known photolithography technique and etching technique.

After the groove is formed in the current limiting insulating layer 112, a 50-nm thick palladium film, a 30-nm thick platinum film, and a 200-nm thick gold film are sequentially deposited and stacked on the current limiting insulating layer 112 including the groove by using an electron beam deposition apparatus, thereby forming a metal layer serving as the p-type metal electrode 113. This metal layer is patterned by using a lift-off technique. Thereafter, a novolac-based positive photoresist pattern is formed by the known photolithography technique, and the crystal layer is etched by using this pattern as a mask to form an exposed region on the electrode layer 104. The crystal layer is etched by reactive ion etching using chlorine gas.

After etching for the formation of the above exposed region, removal of the photoresist pattern, and cleaning of the single-crystal substrate 101 and the structure formed thereon, a 50-nm thick titanium film, a 30-nm thick platinum film, and a 20-nm thick gold film are sequentially deposited on the exposed region of the electrode layer 104, and the resultant structure is patterned to form the n-type metal electrode 114. This metal layer is patterned by using the lift-off technique.

After the manufacturing process is completed up to the formation of the n-type metal electrode 114 through the above steps, the resultant structure is fixed on a polishing base to polish the lower surface of the single-crystal substrate 101 so as to thin it to a thickness of 50 μm while mirror-finishing the polished surface. When the single-crystal substrate 101 polished without mirror-finishing is removed from the polishing base, the single-crystal substrate 101 may warp or crack. For this reason, the lower surface is mirror-finished. Thereafter, the resultant structure is cleaned, and predetermined portions are cut by cleavage or the like, thereby obtaining the semiconductor light-emitting device shown in FIGS. 1A and 1B.

[Second Embodiment]

Another embodiment of the present invention will be described next.

FIG. 8 shows an example of the arrangement of a semiconductor light-emitting device according to this embodiment. An LED (Light-Emitting Diode) will be exemplified. FIG. 8 shows the structure of the LED. This LED includes the following layers on the upper surface of a 330-μm thick single-crystal substrate 201 made of (0001)-oriented sapphire (single-crystal $Al_2O_3$) having both surfaces, i.e., the upper and lower surfaces, polished to mirror surfaces: a 20-nm thick buffer layer 202 made of GaN, a 4-μm thick electrode layer 203 made of Si-doped n-type GaN, and a 0.5-μm thick cladding layer 204 made of Si-doped n-type $Al_{0.1}Ga_{0.9}N$. Note that the single-crystal substrate 201 is not limited to sapphire. For example, this substrate may be made of a crystal such as silicon carbide (SiC), zinc oxide (ZnO), or lithium gallate ($LiGaO_2$).

On the cladding layer 204, the following layers are formed: a 50-nm thick active layer 205 made of InN, a 10-nm thick growth cover layer 206 made of undoped GaN, a 0.5-μm thick cladding layer 207 made of Mg-doped p-type $Al_{0.1}Ga_{0.9}N$, and a 0.1-μm thick contact layer 208 made of Mg-doped p-type GaN. A current limiting insulating layer 209 which has a substantially circular opening window with a diameter of about 20 μm to limit a current injection region is formed on the contact layer 208.

A p-type metal electrode 210 which is in contact with the contact layer 208 through the opening window is formed on the current limiting insulating layer 209. The p-type metal electrode 210 has a multilayer structure constituted by a 50-nm thick nickel layer in direct contact with the contact layer 208 and a 200-nm thick gold layer formed thereon. Note that the electrode layer 203 has an exposed region formed by partly etching the respective layers formed thereon, and an n-type metal electrode 211 in this exposed region. The n-type metal electrode 211 has a multilayer structure constituted by a 50-nm thick aluminum layer in direct contact with the exposed region and a 200-nm thick gold layer formed thereon.

A method of manufacturing the semiconductor light-emitting device shown in FIG. 8 will be described next. An equipment of metalorganic vapor phase epitaxy having a vertical-type reactor is used for crystal growth for the formation of each crystal layer. As a nitrogen source, ammonia is used. As a carrier gas, nitrogen gas is used. The growth pressure is set to atmospheric pressure.

First of all, the substrate temperature is set at 1,050° C., and the surface of the single-crystal substrate 201 made of sapphire is nitrided in an ammonia atmosphere. Thereafter, the substrate temperature is set at 550° C., and the buffer layer 103 is formed by growing GaN. In the growth of this GaN, triethylgallium (TEG) is used as a gallium source, which has a low vapor pressure, is suited to supply of a small amount of Ga, readily decomposes at a low temperature of 550° C., and allows no carbon which is a constituent element of the source to be taken in the grown layer. Subsequently, the single-crystal substrate 201 is annealed at 1,050° C. for 9 min to form the buffer layer 202 into a single crystal.

The temperature of the single-crystal substrate is then set at 1,020° C., and Si-doped n-type GaN and Si-doped n-type $Al_{0.1}Ga_{0.9}N$ are sequentially grown to form the electrode layer 203 and cladding layer 204. As an aluminum source for the vapor phase growth of these layers, trimethylaluminum (TMA) is used. As a gallium source, trimethylgallium (TMG) is used, which has a relatively high vapor pressure. Silane ($SiH_4$) gas which is diluted with hydrogen and has a concentration of 1 ppm is used to dope each layer with Si.

InN is then grown on the cladding layer 204 to form the active layer 205. In the growth of InN, since the nitrogen equilibrium vapor pressure of InN between a solid phase and a gas phase is high, the substrate temperature is set at 500° C. In addition, in this vapor phase growth, trimethylindium (TMI) is used. In this growth process, in order to grow high-quality InN by preventing precipitation of metal In, the ratio of ammonia to TMI, i.e., V/III, is set to 660,000. Nitrogen is used both as a carrier gas and a bubbling gas. This is because the use of hydrogen will suppress the decomposition of ammonia.

GaN is grown at 500° C., which is the same growth temperature for InN, by using a nitrogen carrier gas to suppress etching up to the active layer 207 and a deterioration in its crystallinity, thereby forming the growth cover layer 206. After the growth cover layer 206 is formed, the substrate temperature is raised to 1,020° C. to improve the quality of the growth cover layer 206. Subsequently, Mg-doped p-type $Al_{0.1}Ga_{0.9}N$, and Mg-doped p-type GaN are sequentially grown to form the guiding layer 207 and contact layer 208.

As a source for Mg doping, bis(methylcyclopentadienyl) magnesium is used. This source is a liquid, which is advantageous in controllability and reproducibility of the doping concentration of Mg over bis(cyclopentadienyl)magnesium which is a generally used solid source.

After the guiding layer 207 and contact layer 208 are formed, the resultant structure is annealed in a nitrogen atmosphere at 700° C. for 30 min to activate Mg added to these layers.

After the respective crystal layers described above are formed, the current limiting insulating layer 209 made of $SiO_2$ is formed on the contact layer 208 by using an RF magnetron sputter apparatus, and an opening window is formed in the current limiting insulating layer by the known photolithography technique and etching technique.

After the opening window is formed in the current limiting insulating layer 209, a 50-nm thick nickel film and a 200-nm thick gold film are sequentially deposited and stacked on the current limiting insulating layer 209 including the opening window by using an electron beam deposition apparatus, thereby forming a metal layer serving as the p-type metal electrode 210. Thereafter, a novolac-based positive photoresist pattern is formed on the metal layer by the known photolithography technique, and the metal layer and crystal layer are etched by using this pattern as a mask to form an exposed region on the electrode layer 203. The crystal layer is etched by reactive ion etching using chlorine gas.

After etching for the formation of the above exposed region, removal of the photoresist pattern, and cleaning of the single-crystal substrate 201 and the structure formed thereon, a 50-nm thick aluminum film and a 200-nm thick gold film are sequentially deposited on the exposed region of the electrode layer 204, and the resultant structure is patterned to form the n-type metal electrode 211.

After the manufacturing process is completed up to the formation of the n-type metal electrode 211 in the above manner, the single-crystal substrate 201 is cleaned and cut in a predetermined size by using a diamond scriber, thereby extracting a device. With this process, a chip having the semiconductor light-emitting device shown in FIG. 8 is obtained.

In the semiconductor light-emitting device shown in FIG. 8, the active layer is made of InN. By controlling the composition and thickness of the active layer, desired color light can be obtained, ranging from light with a wavelength near the bandgap wavelength of InN, 1.6 μm, to blue light. The use of InN for the active layer greatly improves reproducibility and in-plane uniformity on the substrate as compared with the use of InGaN for the active layer. This is because InN and InGaN greatly differ in the compositions of gas and solid phases in vapor phase growth.

FIG. 9 shows a result of composition control on InGaN. As shown in FIG. 9, in the growth of InGaN, the composition ratio of a gas phase to a solid phase is linear at a growth temperature (substrate temperature) of 500° C. Note that a composition for InGaN is selected in a region outside the immiscible region shown in FIG. 6. At a growth temperature of 800° C., however, the composition ratio of a gas phase to a solid phase become nonlinear in a region where the solid phase composition ratio of indium (TMI) is high. As shown in this graph, in metalorganic vapor phase epitaxy, as the growth temperature increases, the amount of indium taken in an InGaN film in the process of growth decreases. This is because the equilibrium vapor pressure of nitrogen of InN is five orders of magnitude higher than that of GaN.

As described above, the use of InN for an active layer eliminates the necessity of composition control and makes it possible to ensure reproducibility of a growth process and uniformity of crystallinity as compared with the use of InGaN for an active layer. In addition, since no phase separation theoretically occurs, layers with uniform compositions can be obtained.

Note that the use of $In_{1-X-Y}Ga_XAl_YN$ ($0 \leq X, Y \leq 1, 0 \leq X+Y<1$), which is larger in bandgap than InN, for an active layer makes it possible to obtain light with a shorter wavelength.

In addition, a light-emitting portion may have a multi-quantum well structure. For example, a light-emitting portion may be formed from a multi-quantum well structure formed by stacking following three layers: a well layer made of $In_{0.95}Ga_{0.05}N$ and barrier layers made of Si-doped $In_{0.05}Ga_{0.1}Al_{0.85}N$ sandwiching the well layer.

[Third Embodiment]

A case wherein the structure of the present invention is applied to a semiconductor laser in which a light-emitting portion has a multi-quantum well structure will be described next. FIG. 10 shows an example of the arrangement of a semiconductor light-emitting device according to this embodiment. The semiconductor laser shown in FIG. 10 includes the following layers on the surface of a 330-μm thick single-crystal substrate 301 made of (0001)-oriented sapphire (single-crystal $Al_2O_3$): a 20-nm thick buffer layer 302 made of GaN, a 4-μm thick electrode layer 303 made of Si-doped n-type GaN, and a 0.5-μm thick cladding layer 304 made of Si-doped n-type $Al_{0.14}Ga_{0.86}N$. Note that the single-crystal substrate 301 is not limited to sapphire. For example, this substrate may be made of a crystal such as silicon carbide (SiC), zinc oxide (ZnO), or lithium gallate ($LiGaO_2$).

On the cladding layer 304, a multi-quantum well structure 305 is formed, which is formed by stacking the following three layers: a well layer made of $In_{0.95}Ga_{0.05}N$ and barrier layers made of Si-doped $In_{0.05}Ga_{0.1}Al_{0.85}N$ sandwiching the well layer. On the multi-quantum well structure 305, a 0.5-$\mu$m thick cladding layer 306 made of Mg-doped p-type $Al_{0.14}Ga_{0.86}N$ and a 0.1-$\mu$m thick contact layer 307 made of Mg-doped p-type GaN are formed. A current limiting insulating layer 308 which has a substantially circular opening window with a diameter of about 20 $\mu$m to limit a current injection region is formed on the contact layer 307.

A p-type metal electrode 309 which is in contact with the contact layer 307 through the opening window is formed on the current limiting insulating layer 308. The p-type metal electrode 309 has a multilayer structure constituted by a 50-nm thick palladium layer in direct contact with the contact layer 307, a 30-nm thick platinum layer formed thereon, and a 200-nm thick gold layer formed thereon. This metal layer is patterned by using the lift-off technique. The electrode layer 303 has an exposed region formed by partly etching the respective crystal layers formed thereon, and an n-type metal electrode 310 in this exposed region. The n-type metal electrode 310 has a multilayer structure constituted by a 50-nm thick titanium layer in direct contact with the exposed region, a 30-nm thick platinum layer, and a 200-nm thick gold layer.

In the semiconductor light-emitting device shown in FIG. 10, light emission at wavelengths ranging from a wavelength of 0.62 $\mu$m to a wavelength shorter than the wavelength corresponding to the bandgap energy of InN can be produced by changing the compositions of the active layer and cladding layer and the well layer thickness of the quantum well structure. For example, yellow and orange light emission can be produced. According to the conventional idea, a light-emitting device in this wavelength range could not made of InGaAlN. As described above, however, owing to the finding by the present inventors that the bandgap energy of InN is near 0.8 eV, such a device was manufactured for the first time. By controlling the composition of each layer forming this structure, a 1.48-$\mu$m laser in which the excitation efficiency of an optical communication fiber amplifier using a glass fiber is high or a 1.55-$\mu$m semiconductor laser with a large $T_0$ can be obtained.

[Fourth Embodiment]

Still another embodiment of the present invention will be described next.

FIG. 11 shows an example of the arrangement of a semiconductor light-emitting device according to this embodiment. This semiconductor light-emitting device is a white light-emitting diode having three light-emitting layers. FIG. 11 shows a cross-section of this device in a direction of thickness in crystal growth.

This light-emitting diode includes the following layers on the surface of a 330-$\mu$m thick single-crystal substrate 1101 made of (0001)-oriented sapphire (single-crystal $Al_2O_3$): a 20-nm thick buffer layer 1102 made of GaN, a 4-$\mu$m thick electrode layer 1103 made of Si-doped n-type GaN, and a 0.5-$\mu$m thick cladding layer (first cladding layer) 1104 made of Si-doped n-type $Al_{0.1}Ga_{0.9}N$. Note that the single-crystal substrate 1101 is not limited to sapphire. For example, this substrate may be made of a crystal such as silicon carbide (SiC), zinc oxide (ZnO), or lithium gallate ($LiGaO_2$).

On the cladding layer 1104, the following layers are formed: a barrier layer 1105 made of Si-doped n-type InGaAlN, a lower active layer (first active layer) 1106 made of $In_{1-X}Ga_XN$ with Y=0 in $In_{1-X-Y}Ga_XAl_YN$ ($0 \leq X, Y \leq 1, 0 \leq X+Y<1$), a barrier layer 1107 made of Si-doped n-type InGaAlN, an intermediate active layer (second active layer) 1108 made of $In_{1-X'}Ga_{X'}N$, a barrier layer 1109 made of Si-doped n-type InGaAlN, an upper active layer (third active layer) 1110 made of $In_{1-X''}Ga_{X''}N$, and a barrier layer 1111 made of InGaAlN. On the barrier layer 1111, a 0.5-$\mu$m thick cladding layer (second cladding layer) 1112 made of Mg-doped p-type $Al_{0.1}Ga_{0.9}N$ and a 0.1-$\mu$m thick contact layer 1113 made of Mg-doped p-type GaN are formed.

A current limiting insulating layer 1114 which is made of $SiO_2$ and has a substantially circular opening window with a diameter of about 20 $\mu$m is formed on the contact layer 1113. A p-type metal electrode 1115 which is in contact with the contact layer 1113 through the opening window is formed on the current limiting insulating layer 1114. Although not shown, the p-type metal electrode 1115 has a multilayer structure constituted by a 50-nm thick palladium layer in direct contact with the contact layer 1113, a 30-nm thick platinum layer formed thereon, and a 200-nm thick gold layer formed thereon. Note that the electrode layer 1113 is patterned by the lift-off technique.

Note that the electrode layer 1103 has an exposed region formed by partly etching the respective layers formed thereon, and an n-type metal electrode 1116 in this exposed region. Although not shown, the n-type metal electrode 1116 has a multilayer structure constituted by 50-nm thick titanium layer in direct contact with the exposed region, a 30-nm thick platinum layer, and a 200-nm thick gold layer. Note that the metal electrode 1116 is patterned by the lift-off technique.

In the semiconductor light-emitting device having the above arrangement according to this embodiment, the first light-emitting structure is formed by the barrier layer 1105, lower active layer 1106, and barrier layer 1107, the second light-emitting structure is formed by the barrier layer 1107, intermediate active layer 1108, and barrier layer 1109, and the third light-emitting structure is formed by the barrier layer 1109, upper active layer 1110, and barrier layer 1111. The emission wavelengths of the respective light-emitting structures are set by controlling the compositions and thicknesses of the respective active layers in the manner described later such that the first light-emitting structure has the shortest emission wavelength and the third light-emitting structure has the longest emission wavelength. That is, the nearer to the single-crystal substrate 1101, the light-emitting structures are located, the shorter the oscillation wavelengths become (the larger the bandgaps become). Therefore, the light emitted from the third light-emitting structure emerges from the lower surface of the single-crystal substrate 1101 without being absorbed by the second light-emitting structure and first light-emitting structure.

The light emitted from the second light-emitting structure which emerges to the first light-emitting structure side emerges from the lower surface of the single-crystal substrate 1101 without being absorbed by the first light-emitting structure. The light emitted from the second light-emitting structure which emerges to the third light-emitting structure side is absorbed by the third light-emitting structure. This absorbed light is converted into light equal to that of light emitted from the third light-emitting structure, and emerges as light from the third light-emitting structure from the lower surface of the single-crystal substrate 1101.

The light emitted from the first light-emitting structure which emerges to the single-crystal substrate 1101 side emerges from the lower surface of the single-crystal substrate 1101 without undergoing absorption like that described above. The light emitted from the first light-emitting structure which emerges to the opposite side to the single-crystal substrate 1101 is absorbed by the second or third light-emitting structure. These absorbed light components are converted into light components having wavelengths equal to those of light components emitted from the second or third light-emitting structure and emerge from the lower surface of the single-crystal substrate 1101.

In the semiconductor light-emitting device shown in FIG. 11, InGaN is used for each active layer (well layer). However, the present invention is not limited to this. InN can also be used for an active layer by properly setting the thickness of the active layer and the composition of a barrier layer.

In the semiconductor light-emitting device in FIG. 11 which has the above arrangement, white light emission with high efficiency can be produced with suppressed loss by designing the stacking order of the respective light-emitting structures in consideration of the positional relationship concerning the light extraction direction.

The above semiconductor light-emitting device in which a plurality of light-emitting structures formed from active layers are stacked on each other will be described below.

Conventionally, semiconductor light-emitting devices which can be used as white light sources are generally classified into three types of structures. The first type is a structure which uses three types of light-emitting diodes for respectively emitting light beams of three primary colors, i.e., red, green, and blue, and serves as a white light source by superimposing light beams emitted from the diodes.

The second type is a structure which uses a blue-green light-emitting diode having a quantum well structure with a well layer formed from a ZnCdSe crystal grown on a ZnSe substrate and serves as a white light source which extracts light emission from the diode outside through ZnSe as the substrate. According to this structure, a blue-green light emission is extracted from the quantum well, an orange light emission from a deep energy level which is called an SA emission is then extracted from a defect existing in the ZnSe substrate owing to the extracted blue-green light, and these two light components are mixed to obtain white light.

The third type is a structure obtained by molding a semiconductor chip of a blue light-emitting diode with a plastic material mixed with a phosphor powder. The phosphor powder is made of a phosphor material that emits light ranging from yellow to red. The phosphor in the plastic mold is excited by blue light emitted from the semiconductor chip (light-emitting diode) to emit light ranging from yellow to red. This third structure is designed to obtain white light by mixing blue light from the semiconductor chip with light ranging from yellow to red from the phosphor.

The first structure requires light-emitting diode chips for light beams of three colors. According to a practical arrangement, a total of three light-emitting diode chips for emitting red, green, and blue light beams are integrated. In the first structure, three color light-emitting diode chips are made of different materials and independently formed as three color devices, and then are integrated on the same substrate. In addition, according to the first structure, the optical powers of the three light-emitting diode chips must be adjusted such that the sum of light beams emitted from the three light-emitting diode chips becomes white.

For example, injection currents for the respective light-emitting diode chips were adjusted. In some case, the number of devices for each light emission color was adjusted. As described above, according to the first structure, many devices must be integrated, and injection currents for the respective devices must be adjusted, resulting in interfering with productivity.

The second structure requires a ZnSe substrate which is two orders of magnitude more expensive than semiconductor substrates like Si and GaAs substrates which are widely used, and hence the device price becomes high. In addition, when a semiconductor light-emitting device is to be manufactured by using a ZnSe substrate, molecular beam epitaxy (MBE) is required to form a crystal layer doped with an n-type impurity (carrier). MBE is smaller in throughput than other growth methods.

Assume that a doped crystal layer can be manufactured by MBE. Even in this case, in order to obtain a crystal which can activate the doped carrier to increase the luminous efficiency, the following treatments are required: etching of the substrate, as a substrate treatment before crystal growth, with a special acid that produces no zinc oxide, and removal of a substrate oxide film within the MBE reactor with a hydrogen plasma treatment that does not roughen the substrate surface.

In order to realize the second structure, the rearrangement of a crystal surface must be controlled. For this purpose, a reflection high-energy-electron diffraction image must be simultaneously observed in the process of growth to control a source supply ratio VI/II between a Group II material and a Group VI material from 1.1. to 1.3. In contrast to this, in the growth of a general Group III–V crystal such as GaAs, a source supply ratio V/III is as rough as several hundreds. A high-quality crystal for realizing the second structure can be grown only by using these advanced manufacturing techniques.

The present inventors developed this technique in 1997 and achieve the world's first success in developing a semiconductor laser on a ZnSe substrate (A. Ohki, T. Ohno and T. Matsuoka, "Continuous-Wave Operation of ZnSe-Based Laser Diodes Homoepitaxially Grown on Semi-Insulation ZnSe Substrates", Electron. Lett., 33, 11, pp. 990–991 (1997). T. Ohno, A. Ohki and T. Matsuoka, "Room-Temperature CW Operation of II–VI laser Grown on ZnSe Substrate Cleaned with Hydrogen Plasma", J. Crystal Growth, 184/185, pp. 550–553 (1998). T. Ohno, A. Ohki and T. Matsuoka, "Surface Cleaning with Hydrogen Plasma for Low-Defect-Density ZnSe Homoepitaxial Growth", J. Vac. Sci. Technol. B., 16, 4, pp. 2539–2545 (1998).

After the above development, however, no breakthrough has occurred concerning the second structure at both the industry and academic levels. This is because the crystal itself is fragile and tends to cause defects, which is a fundamental problem concerning the material. In addition, in the second structure, in particular, a problem arises in terms of the intensity of SA emission. In order to obtain white light by using the second structure, the ratio of the intensity of blue light output from the light-emitting diode on the substrate to that of SA emission must be adjusted by controlling the thickness of the ZnSe substrate. Since the intensity of SA emission greatly depends on the properties of a material, this adjustment must be done in accordance with the properties of a ZnSe substrate every time a device is manufactured. This becomes a cause for interfering with productivity.

According to the third structure, the conversion efficiency of injection power into light is equal to the product of the luminous efficiency of a semiconductor chip and the luminous efficiency of a phosphor. Since each luminous efficiency will never be 100%, the light conversion efficiency becomes low. For example, the luminous efficiency of a semiconductor light-emitting device is about 40%, and the luminous efficiency of a phosphor is about 50%. Therefore, the conversion efficiency of injection power into light in the white light-emitting device having the third structure is as low as about 20%. According to this third structure, since the efficiency is almost equal to that of an incandescent lamp and lower than that of a fluorescent lamp, the merits of the semiconductor light-emitting device (LED) are reduced.

As described above, according to the prior art, many manufacturing steps are required to manufacture a semiconductor light-emitting device for white light, and adjustments are required to obtain white light. This makes it difficult to provide an inexpensive, highly luminous, white semiconductor light-emitting device.

In contrast to the prior art described above, according to the semiconductor light-emitting device shown in FIG. 11, there is no need to prepare discrete device chips for three-color light emission. No special manufacturing apparatus or manufacturing method is required, or no complicated adjustment is required. Therefore, according to the semiconductor light-emitting device shown in FIG. 11, a device can be provided at a lower cost.

In addition, according to the semiconductor light-emitting device shown in FIG. 11, since each device can be formed in a smaller area than in the prior art, a plurality of devices can be simultaneously formed on a single substrate. Therefore, when semiconductor light-emitting device chips are to be obtained by cutting them out, more chips can be obtained. In this regard as well, devices can be provided at a lower cost owing to so-called volume efficiency. In addition, since thin devices can be formed, they can be mounted in smaller apparatuses.

A semiconductor laser cavity can also be realized by using the layer arrangement shown in FIG. 11. FIG. 11 shows the exit end face of the semiconductor laser cavity. In this case, a groove with a width of 2 μm is formed in the current limiting insulating layer 1114 to extend in a normal direction to the drawing surface of FIG. 11 so as to reach two ends of the device. The p-type metal electrode 1115 is formed along this groove. The exit end face shown in FIG. 11 is formed by cleavage, and an optical output is extracted from this exit end face in the normal direction to the drawing surface of FIG. 11.

A method of manufacturing the semiconductor light-emitting device shown in FIG. 11 will be described next. First of all, an equipment of metalorganic vapor phase epitaxy having a vertical-type reactor is used for crystal growth for the formation of each crystal layer. As a nitrogen source, ammonia is used. As a carrier gas and bubbling gas, nitrogen gas is used for the growth of a layer containing In, and hydrogen gas is used for the growth of a layer containing no In. The growth pressure is set to atmospheric pressure.

First of all in the growth of layers, the substrate temperature is set at 1,050° C., and the surface of the single-crystal substrate 1101 made of sapphire is cleaned in a hydrogen atmosphere. The substrate temperature is then set at 550° C., and the GaN buffer layer 1102 is formed by growth. In the growth of this GaN, triethylgallium (TEG) is used as a gallium source, which has a low vapor pressure, is suited to supply of a small amount of Ga, readily decomposes at a low temperature of 550° C., and allows no carbon which is a constituent element of the source to be taken in the grown layer.

Subsequently, the single-crystal substrate 1101 is annealed at 1,050° C. for 9 min to form the buffer layer 1102 into a single crystal. The temperature of the single-crystal substrate 1101 is then set at 1,020° C., and Si-doped n-type GaN and Si-doped n-type $Al_{0.1}Ga_{0.9}N$, are sequentially grown to form the electrode layer 1103 and cladding layer 1104. As an aluminum source, trimethylaluminum (TMA) is used. As a gallium source, trimethylgallium (TMG) is used. Silane ($SiH_4$) gas which is diluted with hydrogen and has a concentration of 1 ppm is used to dope each layer with Si. Note that the same source is used for Si doping in the process of growing each layer (to be described later).

Subsequently, the barrier layer 1105, lower active layer 1106, barrier layer 1107, intermediate active layer 1108, barrier layer 1109, upper active layer 1110, and barrier layer 1111 are formed by continuous crystal growth (metalorganic vapor phase epitaxy). In the growth of these layers containing indium, since the equilibrium vapor pressure of nitrogen on the solid phase of InN is high, the growth temperature is set at about 500° C. As an indium source, trimethylindium (TMI) is used. As a gallium source in the growth of these layers containing indium, TEG is used. This is because TEG decomposes at a low temperature and has a low vapor pressure, and hence is suitable for composition control on a crystal layer as compared with TMG.

In this case, in the growth of each layer containing indium, in order to grow a high-quality alloy layer by preventing precipitation of metal indium, the ratio (V/III) of ammonia as a nitrogen source to a Group III source (TMI+TMA+TEG) is set to 660,000. In the growth of layers containing indium, nitrogen is used both as a TMI carrier gas and a bubbling gas. This is because the use of hydrogen as a carrier gas or the like will suppress the decomposition of ammonia (reference 5).

After the growth of the above layers containing indium, the source gas is changed to grow Mg-doped p-type $Al_{0.1}Ga_{0.9}N$ and Mg-doped p-type GaN, thereby forming the cladding layer 1112 and contact layer 1113. As a source for Mg doping, bis(methylcyclopentadienyl)magnesium is used. This source is a liquid, which exhibits better reproducibility of Mg doping concentration than bis (cyclopentadienyl)magnesium which is a generally used solid source.

After the cladding layer 1112 and contact layer 1113 are formed, the resultant structure is annealed in a nitrogen atmosphere at 700° C. for 30 min to activate Mg added to these layers. The current limiting insulating layer 1114 made of $SiO_2$ is formed on the contact layer 1113 by using an RF magnetron sputter apparatus, and an opening window is formed in the layer by the known photolithography technique and etching technique. After the opening window is formed in the current limiting insulating layer 1114, a 50-nm thick palladium film, a 30-nm thick platinum film, and a 200-nm thick gold film are sequentially deposited and stacked on the current limiting insulating layer 1114 including the opening window by using an electron beam deposition apparatus, thereby forming the p-type metal electrode 1115. This metal layer is patterned by the lift-off technique.

The cladding layer 1104 and electrode layer 1103 are then partly removed from the current limiting insulating layer 1114 by the known photolithography technique and etching technique to expose part of the electrode layer 1103. The n-type metal electrode 1116 is formed on this exposed surface. Crystal layers ranging, for example, from the contact layer 1113 to the cladding layer 1104 may be etched by reactive ion etching using chlorine gas as an etching gas. The n-type metal electrode 1116 is formed by stacking a 50-nm thick titanium film, a 30-nm thick platinum film, and a 200-nm thick gold film on the exposed surface of the electrode layer 1103 and patterning the resultant multilayer structure by the known lift-off technique.

After the p-type metal electrode 1115 and the n-type metal electrode 1116 are formed in the manner described above, the lower surface of the single-crystal substrate 1101 is polished to thin the single-crystal substrate 1101 from 450 μm, which is the original thickness, to 200 μm. The lower surface is mirror-finished. After the lower surface of the single-crystal substrate 1101 is mirror-finished, the resultant structure is cleaned, and the single-crystal substrate 1101 is cut in a predetermined size by using a diamond scriber, thereby extracting a device. The device size is set to about 500 μm square.

When a current is supplied to the resultant device having the p-type metal electrode 1115 as an anode and the n-type metal electrode 1116 as a cathode, bluish white light emerging from the lower surface of the single-crystal substrate 1101 is observed. As described above, the light emission obtained by this embodiment is bluish white. However, an emission color with a desired characteristic can be obtained by properly controlling the composition of a crystal layer forming an active layer and the thickness of the active layer.

In the semiconductor light-emitting device in FIG. 11, the three active layers are stacked on each other through the barrier layers. However, the present invention is not limited to this. By properly setting the compositions of crystals forming the respective active layers and the thicknesses of the layers, and designing emission colors of the respective layers, light emission near white can be obtained even by a semiconductor light-emitting device having two active layers stacked on each other through a barrier layer.

[Fifth Embodiment]

Still another embodiment of the present invention will be described next.

Figure 12:
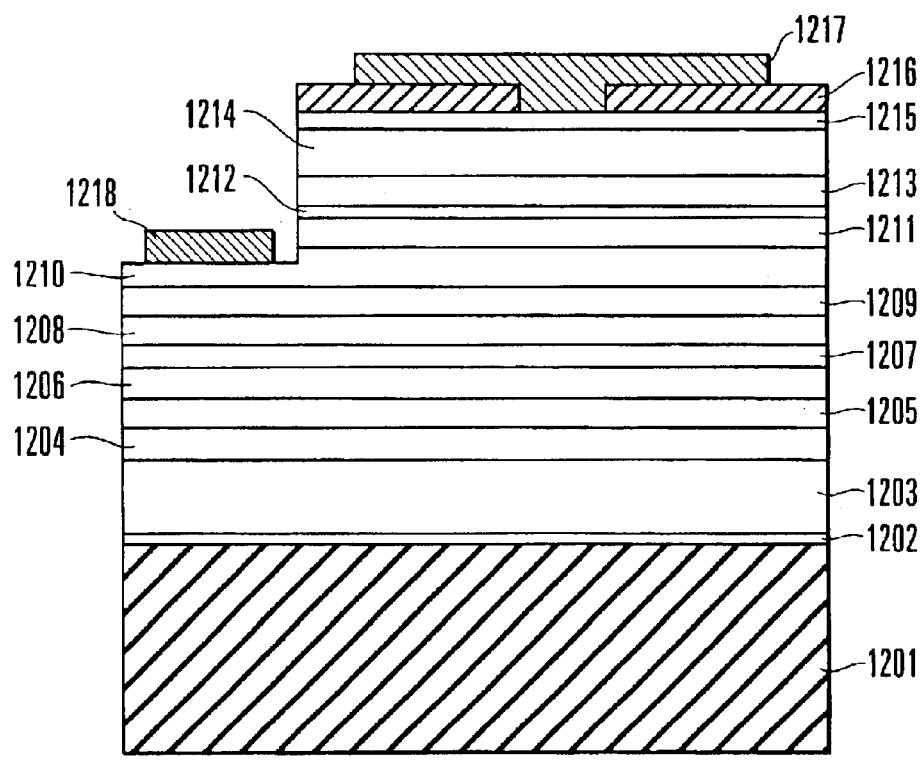
FIG. 12 is a sectional view schematically showing an example of the arrangement of a semiconductor light-emitting device according to still another embodiment of the present invention.

In the semiconductor light-emitting device shown in FIG. 11, the n-type metal electrode 1116 is formed on the electrode layer 1103. However, the present invention is not limited to this. An electrode layer may be formed in one of three light-emitting portions, and a metal electrode may be provided on this layer. This structure will be described in more detail below. FIG. 12 shows an example of the arrangement of a semiconductor light-emitting device according to still another embodiment of the present invention.

This semiconductor light-emitting device (light-emitting diode) includes the following layers on the surface of a 330-μm thick single-crystal substrate 1201 made of (0001)-oriented sapphire (single-crystal $Al_2O_3$): a 20-nm thick buffer layer 1202 made of GaN, a 1-μm thick crystal layer 1203 made of GaN, and a 1-μm thick cladding layer (first cladding layer) 1204 made of AlGaN. Note that the single-crystal substrate 1201 is not limited to sapphire. For example, this substrate may be made of a crystal such as silicon carbide (SiC), zinc oxide (ZnO), or lithium gallate ($LiGaO_2$).

On the cladding layer 1204, the following layers are formed: a barrier layer 1205 made of InGaAlN, a lower active layer (first active layer) 1206 made of InN, a barrier layer 1207 made of InGaAlN, an intermediate active layer (second active layer) 1208 made of InN, a barrier layer 1209 made of InGaAlN, an electrode layer 1210 made of Si-doped n-type GaN, a barrier 1211 made of Si-doped n-type InGaAln, an upper active layer (third active layer) 1212 made of InN, and a barrier layer 1213 made of Mg-doped InGaAlN.

On the barrier layer 1213, a 0.5-μm thick cladding layer (second cladding layer) 1214 made of Mg-doped p-type $Al_{0.1}Ga_{0.9}N$ and a 0.1-μm thick contact layer 1215 made of Mg-doped p-type GaN are formed.

A current limiting insulating layer 1216 which is made of $SiO_2$ and has a substantially circular opening window with a diameter of about 20 μm is formed on the contact layer 1215. A p-type metal electrode 1217 which is in contact with the contact layer 1215 through the opening window is formed on the current limiting insulating layer 1216. The p-type metal electrode 1217 has a multilayer structure constituted by a 50-nm thick palladium layer in direct contact with the contact layer 1215, a 30-nm thick platinum layer formed thereon, and a 200-nm thick gold layer formed thereon.

In addition, in the semiconductor light-emitting device in FIG. 12, the electrode layer 1210 has an exposed region formed by partly etching the respective layers formed thereon, and an n-type metal electrode 1218 in this exposed region. The n-type metal electrode 1218 has a multilayer structure constituted by a 50-nm thick titanium layer in direct contact with the exposed region, a 30-nm thick platinum layer, and a 200-nm thick gold layer.

In the semiconductor light-emitting device in FIG. 12 which has the above multilayer structure, the first light-emitting structure is formed by the barrier layer 1205 and lower active layer 1206, the second light-emitting structure is formed by the barrier layer 1207, intermediate active layer 1208, and barrier layer 1209, and the third light-emitting structure is formed by the barrier layer 1211, upper active layer 1212, and barrier layer 1213. The emission wavelengths of the respective light-emitting structures are set such that the first light-emitting structure has the longest emission wavelength and the third light-emitting structure has the shortest emission wavelength.

Part of the light emitted from the third light-emitting structure is absorbed in the second light-emitting structure and first light-emitting structure, thus exciting the respective light-emitting structures. As a result, the first and second light-emitting structures emit light beams having unique wavelengths. Part of the light emitted from the third light-emitting structure which is not absorbed in the first and second light-emitting structures emerges outside from the lower surface of the single-crystal substrate 1201. Part of the light emitted from the second light-emitting structure is absorbed in the first light-emitting structure, and the remaining part emerges outside from the lower surface of the single-crystal substrate 1201.

The first light-emitting structure can also be excited by the light emitted from the second light-emitting structure. The first light-emitting structure is therefore excited by the light emitted from the second and third light-emitting structures to emit light having a wavelength unique to the first light-emitting structure. High-efficiency light emission with suppressed loss can be obtained by stacking/arranging the respective light-emitting structures in consideration of the positional relationship concerning the light extraction direction. Proper designing of the first, second, and third light-emitting structures can obtain emitted light from the lower surface of the single-crystal substrate 1201 throughout a wide wavelength range including the infrared, visible, and ultraviolet regions.

According to the above description, the first light-emitting structure has the longest emission wavelength, and the third light-emitting structure has the shortest emission wavelength. However, the second light-emitting structure may have the longest emission wavelength. In this case, the respective emission wavelengths satisfy second light-emitting structure>first light-emitting structure>third light-emitting structure. Consider light propagating toward the single-crystal substrate 1201, i.e., the light extraction direction, in this arrangement. The light emitted from the third light-emitting structure is absorbed by the first and second light-emitting structures, as described above. However, light propagating in the light extraction direction undergoes no absorption other than the above absorption. This makes it easy to design a light-emitting structure to obtain desired emitted light.

A method of manufacturing the semiconductor light-emitting device shown in FIG. 12 will be described next. An equipment of metalorganic vapor phase epitaxy having a vertical-type reactor is used for crystal growth for the formation of each crystal layer. As a nitrogen source, ammonia is used. As a carrier gas, nitrogen gas is used. The growth pressure is set to atmospheric pressure.

First of all, the substrate temperature is set at 1,050° C., and the surface of the single-crystal substrate 1201 made of sapphire is cleaned in a hydrogen atmosphere. This surface is then nitrided in an ammonia atmosphere. Thereafter, the substrate temperature is set at 550° C., and the buffer layer 1202 is formed by growing GaN. In the growth of this GaN, as a gallium source, triethylgallium (TEG) is used, which has a low vapor pressure, is suited to supply of a small amount of Ga, readily decomposes at a low temperature of 550° C., and allows no carbon which is a constituent element of the source to be taken in the grown layer.

Subsequently, the single-crystal substrate 1201 is annealed at 1,050° C. for 9 min to form the buffer layer 1202 into a single crystal. A GaN crystal is grown on the buffer layer 1202 to form the crystal layer 1203. The temperature of the single-crystal substrate 1201 is then set at 1,020° C., $Al_{0.1}Ga_{0.9}N$ is grown to form the cladding layer 1204. As an aluminum source, trimethylaluminum (TMA) is used. As a gallium source, trimethylgallium (TMG) is used, which has a relatively high vapor pressure.

Subsequently, the barrier layer 1205, lower active layer 1206, barrier layer 1207, intermediate active layer 1208, barrier layer 1209, electrode layer 1210, barrier layer 1211, upper active layer 1212, barrier layer 1213, cladding layer 1214, and contact layer are formed by continuous crystal growth (metalorganic vapor phase epitaxy). In the growth of these layers containing indium, since the equilibrium vapor pressure of nitrogen on the solid phase of InN is high, the growth temperature is set at about 500° C. As an indium source, trimethylindium (TMI) is used. As a gallium source in the growth of these layers containing indium, TEG is used. This is because TEG decomposes at a low temperature and has a low vapor pressure, and hence is suitable for composition control on a crystal layer as compared with TMG.

In this case, in the growth of each layer containing indium, in order to grow a high-quality alloy layer by preventing precipitation of metal indium, the ratio (V/III) of ammonia as a nitrogen source to a Group III source (TMI+TMA+TEG) is set to 660,000. In the growth of layers containing indium, nitrogen is used both as a carrier gas and a bubbling gas. This is because the use of hydrogen as a carrier gas or the like will suppress the decomposition of ammonia (reference 5).

Silane ($SiH_4$) gas which is diluted with hydrogen and has a concentration of 1 ppm is used to dope a predetermined layer with Si. As a source for Mg doping, bis (methylcyclopentadienyl)magnesium is used. This source is a liquid, which exhibits better reproducibility of Mg doping concentration than bis(cyclopentadienyl)magnesium which is a generally used solid source.

After the cladding layer 1214 and contact layer 1215 are formed, the resultant structure is annealed in a nitrogen atmosphere at 700° C. for 30 min to activate Mg added to these layers. The current limiting insulating layer 1216 made of $SiO_2$ is formed on the contact layer 1215 by using an RF magnetron sputter apparatus, and an opening window is formed in the layer by the known photolithography technique and etching technique. After the opening window is formed in the current limiting insulating layer 1216, a 50-nm thick palladium film, a 30-nm thick platinum film, and a 200-nm thick gold film are sequentially deposited and stacked on the current limiting insulating layer 1216 including the opening window by using an electron beam deposition apparatus, thereby forming the p-type metal electrode 1217. This metal layer is patterned by the lift-off technique.

The barrier 1211 and electrode layer 1210 are then partly removed from the current limiting insulating layer 1216 by the known photolithography technique and etching technique to expose part of the electrode layer 1210. The n-type metal electrode 1218 is formed on this exposed surface. Crystal layers ranging, for example, from the contact layer 1215 to the barrier 1211 may be etched by reactive ion etching using chlorine gas as an etching gas. The n-type metal electrode 1218 is formed by stacking a 50-nm thick titanium film, a 30-nm thick platinum film, and a 200-nm thick gold film on the exposed surface of the electrode layer 1210 and patterning the resultant multilayer structure by the known lift-off technique.

After the p-type metal electrode 1217 and n-type metal electrode 1218 are formed in the manner described above, the lower surface of the single-crystal substrate 1201 is polished to thin the single-crystal substrate 1201 from 450 $\mu$m, which is the original thickness, to 200 $\mu$m. The lower surface is mirror-finished. After the lower surface of the single-crystal substrate 1201 is mirror-finished, the resultant structure is cleaned, and the single-crystal substrate 1201 is cut in a predetermined size by using a diamond scriber, thereby extracting a device. The device size is set to about 500 $\mu$m square.

When a current is supplied to the resultant device having the p-type metal electrode 1217 as an anode and the n-type metal electrode 1218 as a cathode, bluish white light emerging from the lower surface of the single-crystal substrate 1201 is observed. As described above, the light emission obtained by this embodiment is bluish white. However, an emission color with a desired characteristic can be obtained by properly controlling the composition of a crystal layer forming an active layer and the thickness of the active layer.

By properly setting the compositions of crystals forming the respective active layers and the thicknesses of the layers, and designing emission colors of the respective layers, light emission near white can be obtained even by a semiconductor light-emitting device having two active layers stacked on each other through a barrier layer.

[Sixth Embodiment]

Still another embodiment of the present invention will be described next.

Figure 13:
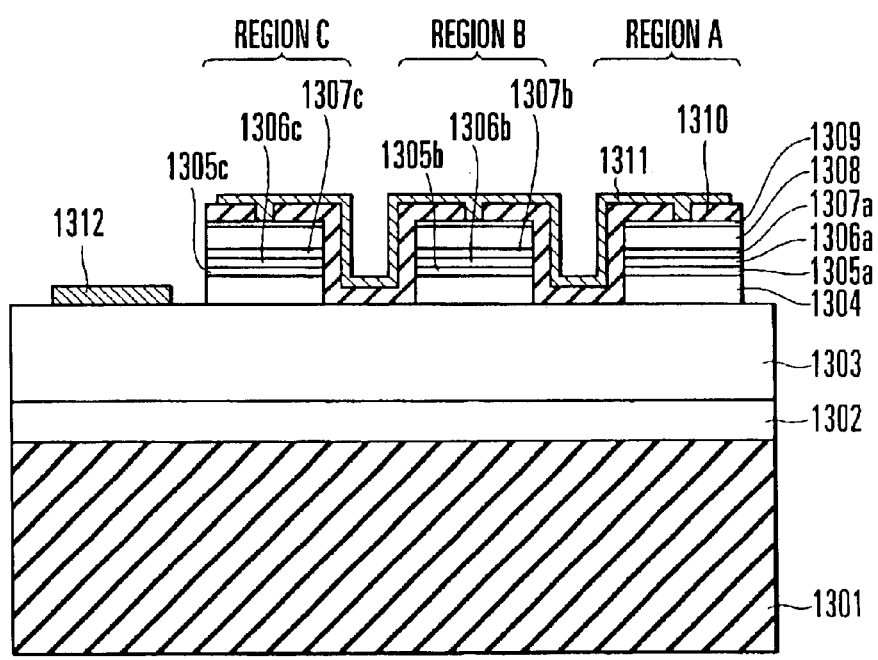
FIG. 13 is a sectional view schematically showing an example of the arrangement of a semiconductor light-emitting device according to still another embodiment of the present invention.

FIG. 13 shows an example of the arrangement of a semiconductor light-emitting device according to this embodiment. This semiconductor light-emitting device is constituted by three light-emitting diodes formed on the same single-crystal substrate. FIG. 13 shows a cross-section of the device in the direction of film thickness in crystal growth.

This semiconductor light-emitting device includes the following layers on the upper surface of a 330-$\mu$m thick single-crystal substrate 1301 made of (0001)-oriented sapphire (single-crystal $Al_2O_3$) having both surfaces mirror-polished: a 20-nm thick buffer layer 1302 made of GaN and a 4-$\mu$m thick electrode layer 1303 made of Si-doped n-type GaN. Note that the single-crystal substrate 1301 is not limited to sapphire. For example, this substrate may be made of a crystal such as silicon carbide (SiC), zinc oxide (ZnO), or $LiGaO_2$.

On the electrode layer 1303, a 0.5-$\mu$m thick cladding layer 1304 made of Si-doped $Al_{0.1}Ga_{0.9}N$, a region A (first light-emitting portion), a region B (second light-emitting portion), and a region C (third light-emitting portion) are formed. The above arrangement is common to the regions A, B, and C but differ in their light-emitting regions, as described next. First of all, the region A includes, on the cladding layer 1304, a $d_A$-nm. thick barrier layer 1305a made of Si-doped n-type $Al_{1-XA}Ga_{XA}N$, an active layer 1306a made of $In_{1-YA}Ga_{YA}N$, and a barrier layer 1307a made of $Al_{1-XA}Ga_{XA}N$. The region B includes, on the cladding layer 1304, a $d_B$-nm thick barrier layer 1305b made of Si-doped n-type $Al_{1-XB}Ga_{XB}N$, an active layer 1306b made of $In_{1-YB}Ga_{YB}N$, and a barrier layer 1307b made of $Al_{1-XB}Ga_{XB}N$. The region C includes, on the cladding layer 1304, a $d_c$-nm thick barrier layer 1305c made of Si-doped n-type $Al_{1-XC}Ga_{XC}N$, an active layer 1306c made of $In_{1-YC}Ga_{YC}N$, and a barrier layer 1307c made of $Al_{1-XC}Ga_{XC}N$.

In addition, each of the regions A, B, and C includes a 0.5-$\mu$m thick cladding layer 1308 made of Mg-doped p-type $Al_{0.1}Ga_{0.9}N$ and a 0.1-$\mu$m thick contact layer 1309 made of Mg-doped p-type GaN on a corresponding one of the barrier layers 1307a, 1307b, and 1307c. Note that InGaN forming each active layer is exemplified by $In_{1-X-Y}Ga_XAl_YN$ ($0 \leq X, Y \leq 1, 0 \leq X+Y<1$) with Y=0.

A current limiting insulating layer 1310 which is made of $SiO_2$ and has substantially circular opening windows each having a diameter of about 20 $\mu$m to limit the current injection region is commonly formed in the regions A, B, and C. A p-type metal electrode 1311 which is in contact with the respective barrier layers 1307a, 1307b, and 1307c through the opening windows is formed on the current limiting insulating layer. The p-type metal electrode 1311 has a multilayer structure constituted by a 50-nm thick nickel layer and a 200-nm thick gold layer.

Note that an n-type metal electrode 1312 is formed in a region of the electrode layer 1303 other than the regions A, B, and C. The n-type metal electrode 1312 has a multilayer structure constituted by a 50-nm thick aluminum layer and a 200-nm thick gold layer.

In this embodiment, each active layer is formed from InN or InGaN containing a small amount of Ga. In the respective regions A, B, and C, the compositions of the active layers and barrier layers and the thicknesses of the active layers are controlled to be different from each other. This makes it possible to obtain a desired light emission color. Note that the bandgap energy of each barrier layer is set to be higher than that of a corresponding active layer.

The use of InN for each active layer will greatly improve reproducibility and in-plane uniformity of the substrate as compared with the use of InGaN for each active layer. This is because the composition of an InGaN film greatly differs between a gas phase and a solid phase in the process of growth, resulting in poor controllability.

FIG. 9 shows a result of composition control on InGaN. As shown in FIG. 9, in the growth of InGaN, the composition ratio of a gas phase to a solid phase is linear at a growth temperature (substrate temperature) of 500° C. Note that a composition for InGaN is selected in a region outside the immiscible region shown in FIG. 6. At a growth temperature of 800° C., however, the composition ratio of a gas phase to a solid phase become nonlinear in a region where the solid phase composition ratio of indium (TMI) is high.

As shown in this graph, in metalorganic vapor phase epitaxy, as the growth temperature increases, the amount of indium taken in an InGaN film in the process of growth decreases. This is because the equilibrium vapor pressure of nitrogen of InN is five orders of magnitude higher than that of GaN.

As described above, the use of InN for an active layer eliminates the necessity of composition control and makes it possible to ensure reproducibility of a growth process and uniformity of crystallinity as compared with the use of InGaN for an active layer. In addition, since no phase separation principally occurs, layers with uniform compositions can be obtained.

In the semiconductor light-emitting device according to this embodiment described above, light emerging from the lower surface side of the single-crystal substrate 1301 is used as output light. In this case, the diameters of the opening portions of the current limiting insulating layer 1310 are uniformly set to 20 $\mu$m in the regions A, B, and C. In order to obtain output light having a desired color tone, the diameter of the hole in each region can be changed. In addition, in the semiconductor light-emitting device shown in FIG. 13, the regions A, B, and C are arrayed on a straight line. Obviously, however, they can be arrayed in an arbitrary manner.

In this embodiment, the common p-type metal electrode 1311 is connected to the regions A, B, and C. However, p-type metal electrodes may be individually provided for the respective regions. In addition, this embodiment has exemplified the case wherein the three regions are formed. However, four or more regions may be formed on a single substrate to obtain higher optical power. In this case, many combinations of regions, each constituted by three regions like those shown in FIG. 13, may be mounted on a single substrate. Alternatively, regions having different structures may be mounted on a single substrate. This arrangement makes it possible to expand the range of color tones of optical power obtained from the semiconductor light-emitting device and increase optical power. In addition, a plurality of combinations, each constituted by regions for respectively emitting red, green, and blue light beams, are arranged in the form of a matrix to form a display.

As described above, in the semiconductor light-emitting device shown in FIG. 13, since a plurality of light-emitting portions including active layers are monolithically formed on a single substrate, there is no need to prepare discrete device chips for three-color light emission. No special manufacturing apparatus or manufacturing method is required, or no complicated adjustment is required. Therefore, according to the semiconductor light-emitting device shown in FIG. 13, a device can be provided at a lower cost.

In addition, according to the semiconductor light-emitting device shown in FIG. 13, since each device can be formed in a smaller area than in the prior art, a plurality of devices can be simultaneously formed on a single substrate. Therefore, when semiconductor light-emitting device chips are to be obtained by cutting them out, more chips can be obtained. In this regard as well, devices can be provided at a lower cost owing to so-called volume efficiency. In addition, since thin devices can be formed, they can be mounted in smaller apparatuses.

A method of manufacturing the semiconductor light-emitting device shown in FIG. 13 will be described next. An equipment of metalorganic vapor phase epitaxy having a vertical-type reactor is used for crystal growth for the formation of each crystal layer. As a nitrogen source, ammonia is used. As a carrier gas, nitrogen gas is used. The growth pressure is set to atmospheric pressure.

First of all, the substrate temperature is set at 1,050° C., and the surface of the single-crystal substrate 1301 made of sapphire is nitrided in an ammonia atmosphere. The substrate temperature is then set at 550° C., and the GaN buffer layer 1302 is formed by growing GaN. In the growth of this GaN, triethylgallium (TEG) is used as a gallium source, which has a low vapor pressure, is suited to supply of a small amount of Ga, readily decomposes at a low temperature of 550° C., and allows no carbon which is a constituent element of the source to be taken in the grown layer.

Subsequently, the single-crystal substrate 1301 is annealed at 1,050° C. for 9 min to form the buffer layer 1302 into a single crystal. The temperature of the single-crystal substrate 1301 is then set at 1,020° C., and Si-doped n-type GaN is grown to form the electrode layer 1303. Silane ($SiH_4$) gas which is diluted with hydrogen and has a concentration of 1 ppm is used to dope each layer with Si. Note that the same source is used for Si doping in the process of growing each layer (to be described later).

Subsequently, the regions other than the region A are covered with a silicon oxide film, and Si-doped n-type $Al_{0.1}Ga_{0.9}N$ is grown on a portion of the electrode layer 1303 which is exposed in the region A to form the cladding layer 1304. The above silicon oxide film serves as a selective growth mask. As an aluminum source, trimethylaluminum (TMA) is used. As a gallium source, trimethylgallium (TMG) is used, which has a relatively high vapor pressure. On the cladding layer 1304 in the region A, Si-doped n-type $Al_{1-XA}Ga_{XA}N$, $In_{1-YA}Ga_{YA}N$, and $Al_{1-XA}Ga_{XA}N$ are sequentially grown by successive crystal growth (metalorganic vapor phase epitaxy) to form the barrier layer 1305a, active layer 1306a, and barrier layer 1307a.

After the barrier layer 1307a is formed, Mg-doped p-type $Al_{0.1}Ga_{0.9}N$ is grown to form the cladding layer 1308. Mg-doped p-type GaN is grown on the cladding layer 1308 to form the contact layer 1309. As a source for Mg doping, bis(methylcyclopentadienyl)magnesium is used. This source is a liquid, which is advantageous in reproducibility of the doping concentration of Mg over bis(cyclopentadienyl) magnesium which is a generally used solid source.

In the growth of these layers containing indium, since the equilibrium vapor pressure of nitrogen on the solid phase of InN is high, the growth temperature is set at about 500° C. As an indium source, trimethylindium (TMI) is used. As a gallium source in the growth of these layers containing indium, TEG is used. This is because TEG decomposes at a low temperature and has a low vapor pressure, and hence is suitable for composition control on a crystal layer as compared with TMG.

In this case, in the growth of each layer containing indium, in order to grow a high-quality alloy layer by preventing precipitation of metal indium, the ratio (V/III) of ammonia as a nitrogen source to a Group III source (TMI+TMA+TEG) is set to 660,000. In the growth of layers containing indium, nitrogen is used both as a carrier gas and a bubbling gas. This is because the use of hydrogen as a carrier gas or the like will suppress the decomposition of ammonia (reference 5). The above description applies to the regions B and C (to be described below).

The silicon oxide film which is grown as a selective growth mask and covers the regions other than the region A is removed by using, for example, a hydrofluoric acid solution. Thereafter, a selective growth mask made of silicon oxide is formed to cover the regions other than the region B. Si-doped n-type $Al_{0.1}Ga_{0.9}N$ is grown on the electrode layer 1303 exposed in the region B to form the cladding layer 1304. Si-doped n-type $Al_{1-XB}Ga_{XB}N$, $In_{1-YB}Ga_{YB}N$, and $Al_{1-XB}Ga_{XB}N$ are sequentially grown on the cladding layer 1304 in the region B by successive crystal growth to form the barrier layer 1305b, active layer 1306b, and barrier layer 1307b. After the formation of the barrier layer 1307b, Mg-doped p-type $Al_{0.1}Ga_{0.9}N$ is grown to form the cladding layer 1308. Mg-doped p-type GaN is grown on this cladding layer to form the contact layer 1309.

The selective growth mask covering the regions other than the region B is removed, and a selective growth mask covering the regions other than the region C is formed. Thereafter, in the same manner as described above, Si-doped n-type $Al_{0.1}Ga_{0.9}N$ is grown on the electrode layer 1303 exposed in the region C to form the cladding layer 1304. On the cladding layer 1304 in the region C, Si-doped n-type $Al_{1-XC}Ga_{XC}N$, $In_{1-YC}Ga_{YC}N$, and $Al_{1-XC}Ga_{XC}N$ are sequentially grown on the cladding layer 1304 in the region C by successive crystal growth to form the barrier layer 1305c, active layer 1306c, and barrier layer 1307c. After the formation of the barrier layer 1307b, Mg-doped p-type $Al_{0.1}Ga_{0.9}N$ is grown to form the cladding layer 1308, and Mg-doped p-type GaN is grown on this cladding layer to form the contact layer 1309.

Subsequently, the resultant structure is annealed in a nitrogen atmosphere at 700° C. for 30 min to activate Mg added to the cladding layer 1308 and contact layer 1309 in the regions A, B, and C. The current limiting insulating layer 1310 made of $SiO_2$ is formed on the contact layer 1309 in the regions A, B, and C by using an RF magnetron sputter apparatus, and is processed by the known photolithography technique and etching technique to form opening windows for the respective regions A, B, and C.

After the opening windows are formed in the current limiting insulating layer 1310, a 50-nm thick palladium film, a 30-nm thick platinum film, and a 200-nm thick gold film are sequentially stacked on the current limiting insulating layer 1310 including the opening windows by using an electron beam deposition apparatus, thereby forming the p-type metal electrode 1311 throughout the regions A, B, and C. This metal layer is patterned by the lift-off technique.

The n-type metal electrode 1312 is formed on an exposed surface of the electrode layer 1303 other than the regions A, B, and C. The n-type metal electrode 1312 is formed by stacking a 50-nm thick aluminum film and a 200-nm thick gold film on the exposed surface of the electrode layer 1303 and patterning the resultant multilayer structure by the known photolithography technique and etching technique.

A semiconductor laser cavity can also be realized by using the layer arrangement shown in FIG. 13. FIG. 13 shows the exit end face of the semiconductor laser cavity. In this case, a groove with a width of 1.5 µm is formed in the current limiting insulating layer 1310 to extend in a normal direction to the drawing surface of FIG. 13 so as to reach two ends of each of the regions A, B, and C. The p-type metal electrode 1311 is formed along each groove. Note that the regions A, B, and C are arranged at intervals of 10 µm. The exit end face shown in FIG. 13 is formed by cleavage, and an optical output is extracted from this exit end face in the normal direction to the drawing surface of FIG. 13.

[Seventh Embodiment]

Still another embodiment of the present invention will be described next.

Figure 14A:
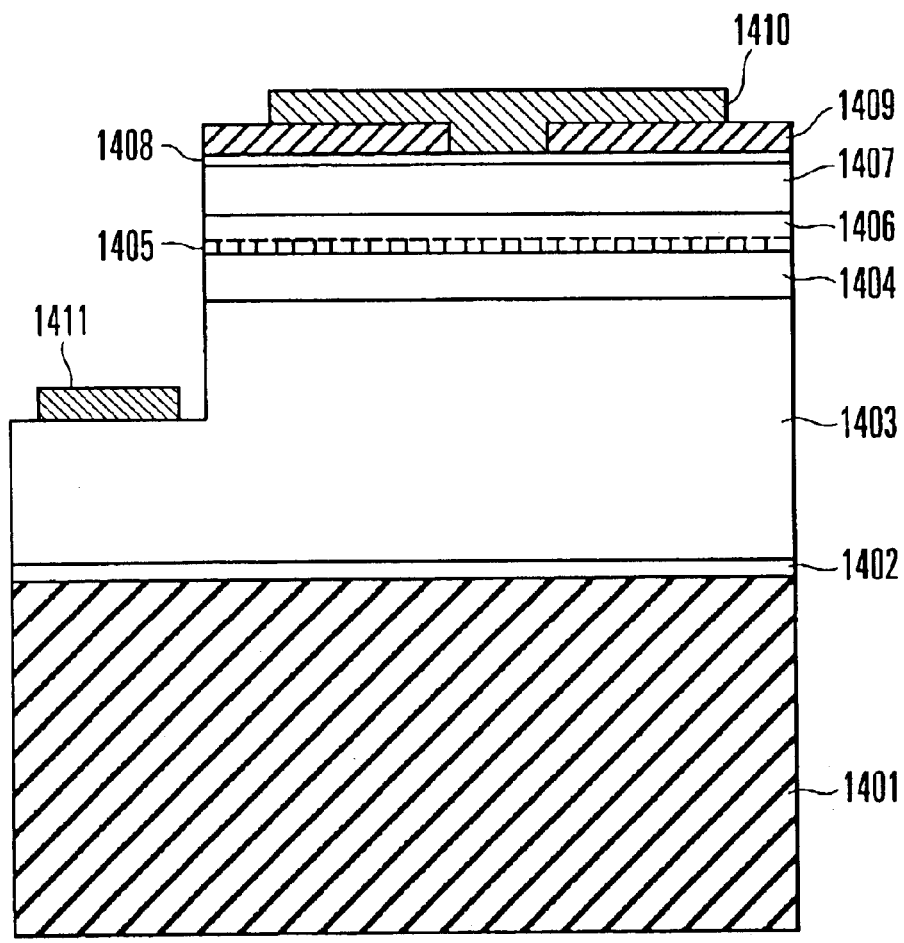
FIG. 14A is a sectional view schematically showing an example of the arrangement of a semiconductor light-emitting device according to still another embodiment of the present invention.
Figure 14B:
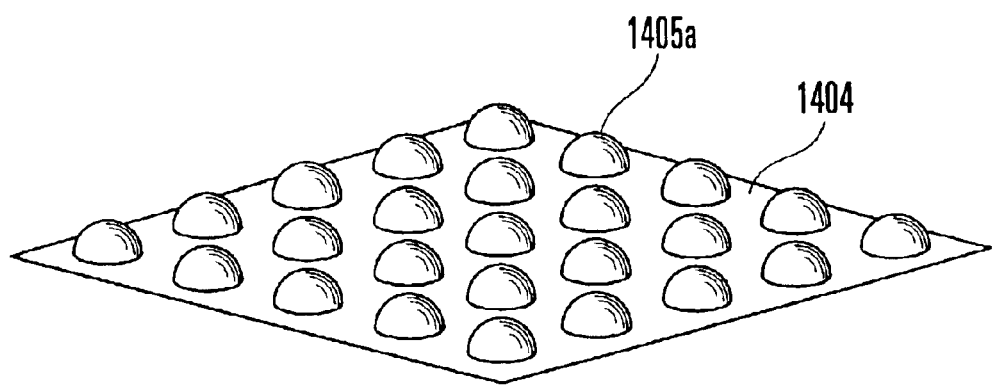
FIG. 14B is a sectional view schematically showing an example of the arrangement of part of the semiconductor light-emitting device according to still another embodiment of the present invention.

FIGS. 14A and 14B show an example of the arrangement of a semiconductor light-emitting device according to this embodiment. An LED (Light-Emitting Diode) will be exemplified. The LED shown in FIGS. 14A and 14B includes the following layers on the upper surface of a 330-µm thick single-crystal substrate 1401 made of (0001)-oriented sapphire (single-crystal $Al_2O_3$) having both surfaces, i.e., the upper and lower surfaces, polished to mirror surfaces: a 20-nm thick buffer layer 1402 made of GaN, a 4-$\mu$m thick electrode layer 1403 made of Si-doped n-type GaN, and a 0.5-$\mu$m thick cladding layer 1404 made of Si-doped n-type $Al_{0.1}Ga_{0.9}N$. Note that the single-crystal substrate 1401 is not limited to sapphire. For example, this substrate may be made of a crystal such as silicon carbide (SiC), zinc oxide (ZnO), or lithium gallate ($LiGaO_2$).

An active layer 1405 shown in FIG. 14B is formed on the cladding layer 1404. The active layer 1405 has a structure in which a plurality of island portions 1405a made of InN are arrayed in the same plane. For example, each island portion 1405a is formed to have a diameter of about 10 nm and a height of about 3 nm. By setting the size of each island portion 1405a to be equal to or smaller than the spread of the wave function of an electron in this manner, a quantum effect can be obtained. The emission wavelength of the semiconductor light-emitting device based on the active layer 1405 is almost determined by the size of each island portion 1405a. Note that the size of each island portion 1405a is not limited to be equal to or smaller than the spread of the wave function of an electron, and may be larger.

Although FIG. 14B shows the island portions 1405a having semispherical shapes, the present invention is not limited to this. For example, the island portions 1405a may have a cylindrical, prism, pyramid, or cone shape. In addition, referring to FIG. 14B, the island portions 1405a are arrayed at equal intervals. However, the present invention is not limited to this. The island portions 1405a may be arranged at nonuniform intervals. In addition, the respective island portions 1405a may be formed to be completely isolated from each other or to be connected to each other through thin InN films forming the island portions 1405a. Note that the respective island portions 1405a are formed to have almost the same size to obtain light emitted with narrow specrum range. Of course, to obtain the light emitted with wide specrum range from this device, the size of islands may differ.

The active layer 1405 formed from the plurality of island portions 1405a in the above manner is covered with a 10-nm thick growth cover layer (barrier layer) 1406 made of undoped GaN.

A 0.5-$\mu$m thick cladding layer 1407 made of Mg-doped p-type $Al_{0.1}Ga_{0.9}N$ and a 0.1-$\mu$m thick contact layer 1408 made of Mg-doped p-type GaN are formed on the growth cover layer 1406. A current limiting insulating layer 1409 which is made of $SiO_2$ and has a substantially circular opening window with a diameter of about 20 $\mu$m to limit a current injection region is formed on the contact layer 1408.

A p-type metal electrode 1410 which is in contact with the contact layer 1408 through the opening window is formed on the current limiting insulating layer 1409. The p-type metal electrode 1410 has a multilayer structure constituted by a 50-nm thick nickel layer in direct contact with the contact layer 1408 and a 200-nm thick gold layer formed thereon. Note that the electrode layer 1403 has an exposed region formed by partly etching the metal layer and crystal layer formed thereon, and an n-type metal electrode 1411 in this exposed region. The n-type metal electrode 1411 has a multilayer structure constituted by a 50-nm thick aluminum layer in direct contact with the exposed region and a 200-nm thick gold layer formed thereon.

A method of manufacturing the semiconductor light-emitting device according to this embodiment shown in FIGS. 14A and 14B will be described next. An equipment of metalorganic vapor phase epitaxy having a vertical-type reactor is used for crystal growth for the formation of each crystal layer. As a nitrogen source, ammonia is used. As a carrier gas, nitrogen gas is used. The growth pressure is set to atmospheric pressure.

First of all, the substrate temperature is set at 1,050° C., and the surface of the single-crystal substrate 1401 made of sapphire is nitrided in an ammonia atmosphere. Thereafter, the substrate temperature is set at 550° C., and the buffer layer 1402 is formed by growing GaN. In the growth of this GaN, triethylgallium (TEG) is used as a gallium source, which has a low vapor pressure, is suited to supply of a small amount of Ga, readily decomposes at a low temperature of 550° C., and allows no carbon which is a constituent element of the source to be taken in the grown layer. Subsequently, the single-crystal substrate 1401 is annealed at 1,050° C. for 9 min to form the buffer layer 1402 into a single crystal.

The temperature of the single-crystal substrate is then set at 1,020° C., and Si-doped n-type GaN and Si-doped n-type $Al_{0.1}Ga_{0.9}N$ are sequentially grown to form the electrode layer 1403 and cladding layer 1404. As an aluminum source for the vapor phase growth of these layers, trimethylaluminum (TMA) is used. As a gallium source, trimethylgallium (TMG) is used, which has a relatively high vapor pressure. Silane ($SiH_4$) gas which is diluted with hydrogen and has a concentration of 1 ppm is used to dope each layer with Si.

InN is then grown in the form of islands on the cladding layer 1404 to form the active layer 1405 formed from the plurality of island portions 1405a. In forming the island portions 1405a, first of all, InN is grown in the form of a film or in a film-like state on the cladding layer 1404. In the growth of InN, since the equilibrium vapor pressure of nitrogen on the solid phase of InN is high, the substrate temperature is set at 500° C. In addition, in this vapor phase growth, trimethylindium (TMI) is used as an indium source. In this growth process, in order to grow high-quality InN by preventing precipitation of metal In, the ratio of ammonia to TMI, i.e., V/III, is set to 660,000. Nitrogen is used both as a carrier gas and a bubbling gas. This is because the use of hydrogen will suppress the decomposition of ammonia.

After InN is grown in the form of a film in the above manner, this film is heated in a nitrogen atmosphere at 700° C. for 20 min. The film-like InN layer is formed into the plurality of island portions 1405a by this heating.

The island portions 1405a may be formed in the following manner. High-quality InN is grown by using the above source gas while preventing precipitation of metal indium, and the V/III ratio, growth temperature, and growth rate are designed to promote migration of indium atoms adsorbing on the underlayer, thereby growing InN in the form of islands.

To suppress etching to the active layer 1405 and a deterioration in the crystallinity of this layer, GaN is then grown at the same growth temperature as that for InN by using a nitrogen carrier gas to form the growth cover layer 1406 covering the island portions 1405a. The growth cover layer 1406 becomes a barrier layer with respect to the plurality of island portions 1405a made of InN.

After the growth cover layer 1406 is formed, the substrate temperature is raised to 1,020° C. to improve the quality of the growth cover layer 1406. Subsequently, Mg-doped p-type $Al_{0.1}Ga_{0.9}N$ and Mg-doped p-type GaN are sequentially grown to form the cladding layer 1407 and contact layer 1408. As a source for Mg doping, bis(methylcyclopentadienyl)magnesium is used. This source is a liquid, which is advantageous in controllability and reproducibility of the doping concentration of Mg over bis(cyclopentadienyl)magnesium which is a generally used solid source.

After the cladding layer 1407 and contact layer 1408 are formed, the resultant structure is annealed in a nitrogen atmosphere at 700° C. for 30 min to activate Mg added to these layers.

After the respective crystal layers described above are formed, the current limiting insulating layer 1409 made of $SiO_2$ is formed on the contact layer 1408 by using an RF magnetron sputter apparatus, and an opening window is formed in the current limiting insulating layer by the known photolithography technique and etching technique.

After the opening window is formed in the current limiting insulating layer 1409, a 50-nm thick nickel film and a 100-nm thick gold film are sequentially deposited and stacked on the current limiting insulating layer 1409 including the opening window by using an electron beam deposition apparatus, thereby forming a metal layer serving as the p-type metal electrode 1410. Thereafter, a novolac-based positive photoresist pattern is formed on the metal layer by the known photolithography technique, and the underlayer is etched by using this pattern as a mask to form an exposed region on the electrode layer 1403. In this etching, for example, etching of the crystal layer, is performed by reactive ion etching using chlorine gas.

After etching for the formation of the above exposed region, removal of the photoresist pattern, and cleaning of the single-crystal substrate 1401 and the structure formed thereon, a 50-nm thick aluminum film and a 200-nm thick gold film are sequentially deposited on the exposed region of the electrode layer 1403, and the resultant structure is patterned to form the n-type metal electrode 1411.

After the manufacturing process is completed up to the formation of the n-type metal electrode 1411 in the above manner, the resultant structure is cleaned, and the single-crystal substrate 1401 is cut in a predetermined size by using a diamond scriber, thereby extracting a device. When a predetermined current is supplied to the extracted device to make it operate, emitted light is obtained from the lower surface side of the single-crystal substrate 1401.

As described above, in this embodiment, the active layer 1405 is constituted by the plurality of island portions 1405*a* which are isolated in the form of islands. In other words, the active layer 1405 is constituted by an aggregate of discrete quantum well layers or a plurality of quantum dots. In the semiconductor light-emitting device having this arrangement, the emission wavelength changes depending on the shape of each island portion 1405*a* and the composition and thickness of a layer (growth cover layer 1406) formed to cover the island portions 1405*a*. This is because the bandgap energy of InN forming the island portions 1405*a* changes depending on a pressure (hydrostatic pressure) three-dimensionally applied to the island portions 1405*a* made of InN.

InGaAlN-based materials such as InN differ in their lattice constants in a wide range as compared with InGaAsP-based materials, and hence a high hydrostatic pressure can be easily applied to the island portions 1405*a* by covering them with a layer with a changed composition. The use of an InGaAlN-based material can therefore greatly change the bandgap energy of the island portions 1405*a* as compared with the use of an InGaAsP-based material.

Since the bandgap energy can be greatly changed in this manner, according to the semiconductor light-emitting device of this embodiment shown in FIGS. 14A and 14B, light emissions can be obtained in a wide wavelength range from near 1.6 μm, which is the bandgap wavelength of InN, to the ultraviolet region.

Even if the island portions 1405*a* are made of another InGaAlN-based material such as InGaN, an effect similar to the above effect can be obtained. By forming the island portions 1405*a* using $In_{1-X-Y}Ga_XAl_YN$ ($0 \leq X$, $Y \leq 1$, $0 \leq X+Y < 1$) larger in bandgap than InN, a semiconductor light-emitting device designed to emit light with a shorter wavelength can be obtained.

When the island portions 1405*a* are formed by using InN, high reproducibility and in-plane uniformity in the manufacture of the island portions 1405*a* can be obtained as compared with use of InGaN. The reasons for this will be described next.

Reason 1

In the vapor phase growth of a material other than InN, e.g., InGaN, the composition of each element in a gas phase greatly differs from that in a solid phase.

As shown in FIG. 9, as the supply amount of TMI is increased by changing the supply ratio (TMI/(TMI+TEG)) of trimethylindium (TMI) to the sum of triethylgallium (TEG) and TMI, the ratio of In in InGaN increases.

This gas phase/solid phase relationship is linear at a growth temperature of 500° C. When, however, the growth temperature is raised to 800° C. and InGaN with a high In composition is grown, the gas phase/solid phase relationship becomes nonlinear. In addition, with a rise in temperature, the amount of indium taken in decreases. This is because the equilibrium vapor pressure of nitrogen of InN is five orders of magnitude higher than that of GaN.

Reason 2

In the case of InGaN, as shown in FIG. 6, phase separation often occurs. As shown in FIG. 6, under a thermal equilibrium condition, there is a composition region that cannot be grown, i.e., a wide region in which phase separation occurs. However, since InN is a binary compound, no phase separation like that described above principally occurs. The use of InN therefore can obtain high reproducibility and in-plane uniformity in the manufacture of the island portions 1405*a*.

Reason 3

The differences in adsorption rate and migration rate between In atoms and Ga atoms on the cladding layer 1404 are also large factors.

Referring to FIG. 14A, the active layer 1405 is formed from one layer with the plurality of island portions 1405*a*. However, the present invention is not limited to this. The active layer 1405 may be formed by stacking a plurality of layers, each constituted by a plurality of island portions 1405*a*, through the growth cover layer 1406.

[Eight Embodiment]

Still another embodiment of the present invention will be described next.

Figure 15:
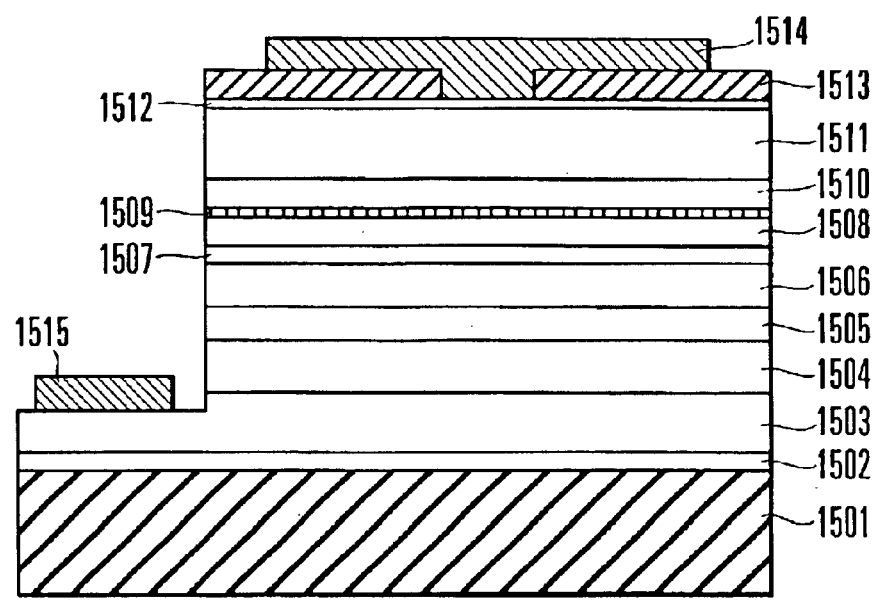
FIG. 15 is a sectional view schematically showing an example of the arrangement of a semiconductor light-emitting device according to still another embodiment of the present invention.

FIG. 15 shows an example of the arrangement of a semiconductor light-emitting device according to this embodiment. This semiconductor light-emitting device is a white light-emitting diode having three light-emitting layers. FIG. 15 shows a cross-sectional view of the device in a direction of thickness in crystal growth.

This light-emitting diode includes the following layers on the surface of a 330-μm thick single-crystal substrate 1501 made of (0001)-oriented sapphire (single-crystal $Al_2O_3$): a 20-nm thick buffer layer 1502 made of GaN and a 4-μm thick electrode layer 1503 made of Si-doped n-type GaN. Note that the single-crystal substrate 1501 is not limited to sapphire. For example, this substrate may be made of a crystal such as silicon carbide (SiC), zinc oxide (ZnO), or lithium gallate ($LiGaO_2$).

On the electrode layer 1503, the following layers are formed: a barrier layer 1504 made of Si-doped n-type InGaAlN, a lower active layer 1505 which serves as a quantum well and is made of $In_XGa_{1-X}N$, a barrier layer

1506 made of InGaAlN, an intermediate active layer 1507 which serves as a quantum well and is made of $In_YGa_{1-Y}N$, and a barrier layer 1508 made of InGaAlN. Note that in the lower active layer 1505 and intermediate active layer 1507, X<Y. The barrier layers 1506 and 1508 may be formed as $n^-$-type layers doped with a smaller amount of Si than those for the remaining layers.

An upper active layer 1509 formed from a layer having a structure in which a plurality of island portions made of InN are arrayed in the same plane is formed on the barrier layer 1508.

For example, each of a plurality of island portions forming the upper active layer 1509 has a diameter of about 10 nm and a height of about 3 nm like the island portions 1405$a$ shown in FIG. 14B. By setting the size of each island portion to be equal to or smaller than the spread of the wave function of an electron in this manner, a quantum effect can be obtained. The emission wavelength of the semiconductor light-emitting device based on the active layer 1509 is almost determined by the size of each island portion. Note that the size of each island portion is not limited to be equal to or smaller than the spread of the wave function of an electron, and may be larger.

Note that the shape of each island portion is not limited to a semispherical shape. For example, the island portions may have a cylindrical, prism, pyramid or cone shape. In addition, the island portions may be arrayed at equal intervals or may be arranged at nonuniform intervals. In addition, the respective island portions may be formed to be completely isolated from each other or to be connected to each other through thin InN films forming the island portions. Note that the respective island portions are formed to have almost the same size.

The upper active layer 1509 formed from a plurality of island portions formed in the above manner is covered with a 0.5-$\mu$m thick barrier layer 1510 made of Mg-doped p-type InGaAlN. A 0.5-$\mu$m thick cladding layer 1511 made of Mg-doped p-type $Al_{0.1}Ga_{0.9}N$ and a 0.1-$\mu$m thick contact layer 1512 made of Mg-doped p-type GaN are formed on the barrier layer 1510.

A current limiting insulating layer 1513 which is made of $SiO_2$ and has a substantially circular opening window with a diameter of about 20 $\mu$m is formed on the contact layer 1512. A p-type metal electrode 1514 which is in contact with the contact layer 1512 through the opening window is formed on the current limiting insulating layer 1513. Although not shown, the p-type metal electrode 1514 has a multilayer structure constituted by a 50-nm thick palladium layer in direct contact with the contact layer 1512, a 30-nm thick platinum layer formed thereon, and a 200-nm thick gold layer formed thereon.

Note that the electrode layer 1503 has an exposed region formed by partly etching the crystal layer formed thereon, and an n-type metal electrode 1515 is formed in this exposed region. Although not shown, the n-type metal electrode 1515 has a multilayer structure constituted by a 50-nm thick titanium layer in direct contact with the exposed region, a 30-nm thick platinum layer, and a 200-nm thick gold layer formed thereon. The above semiconductor light-emitting device can be manufactured by the same method as that for the semiconductor light-emitting device of the embodiment shown in FIG. 14A.

In the semiconductor light-emitting device according to this embodiment which has the above arrangement, the first light-emitting structure is formed by the barrier layer 1504, lower active layer 1505, and barrier layer 1506. The second light-emitting structure is formed by the barrier layer 1506, intermediate active layer 1507, and barrier layer 1508. The third light-emitting structure is formed by the barrier layer 1508, upper active layer 1509, and barrier layer 1510.

The emission wavelengths of the respective light-emitting structures are set by controlling the compositions and thicknesses of the respective active layers in the manner described later such that the first light-emitting structure has the shortest emission wavelength and the third light-emitting structure has the longest emission wavelength. That is, the nearer to the single-crystal substrate 1501, the light-emitting structures are located, the shorter the emission wavelengths become (the larger the bandgaps become). Therefore, light emitted from the third light-emitting structure emerges from the lower surface of the single-crystal substrate 1501 without being absorbed by the second light-emitting structure and first light-emitting structure.

Light emitted from the second light-emitting structure which emerges to the first light-emitting structure side emerges from the lower surface of the single-crystal substrate 1101 without being absorbed by the first light-emitting structure. Light emitted from the second light-emitting structure which emerges to the third light-emitting structure side is partly absorbed by the third light-emitting structure. The third light-emitting structure is excited to emit light by the light absorbed by the third light-emitting structure. That is, the light which emerges from the second light-emitting structure and is absorbed by the third light-emitting structure is converted into light having a wavelength equal to that of light emitted from the third light-emitting structure. This light emerged from the lower surface of the single-crystal substrate 1501 without being absorbed by the second and first light-emitting structures.

Part of the light emitted from the first light-emitting structure which emerges to the single-crystal substrate 1501 directly emerges from the lower surface of the single-crystal substrate 1501. Part of the light emitted from the first light-emitting structure which emerges to the second and third light-emitting structures is partly absorbed by each light-emitting structure to be converted into light having a wavelength equal to that of light emitted from each light-emitting structure. As described above, each converted light emerges as light from a corresponding one of the light-emitting structures from the lower surface of the single-crystal substrate 1501. High-efficiency light emission can be obtained by designing the stacking order of light-emitting layers in consideration of the positional relationship concerning the light extraction direction in this manner. Note that the relationship in emission wavelength among the respective light-emitting structures is not limited to that described above. For example, the second light-emitting structure may have the longest emission wavelength.

When a current is supplied to the resultant device having the p-type metal electrode 1514 as an anode and the n-type metal electrode 1515 as a cathode, bluish white light emerging from the lower surface of the single-crystal substrate 1501 is observed. The color of light emission obtained from this semiconductor light-emitting device can be changed by controlling the structure factors of each active layer, i.e., the composition and thickness of each layer, the diameter of each island portion, and the composition and thickness of a crystal layer (barrier layer) around each region.

In the semiconductor light-emitting device in FIG. 15, the three active layers are stacked on each other through the barrier layers. However, the present invention is not limited to this. By properly setting the compositions of crystals forming the respective active layers and the thicknesses of the layers, and designing emission colors of the respective layers, light emission near white can be obtained even by a semiconductor light-emitting device having two active layers stacked on each other through a barrier layer.

In addition, the lower active layer 1505 or intermediate active layer 1507 may be constituted by a plurality of island portions made of InGaN or InN.

According to the above semiconductor light-emitting device shown in FIG. 15, like the semiconductor light-emitting device shown in FIG. 11, there is no need to prepare discrete device chips for three-color light emission. No special manufacturing apparatus or manufacturing method is required, or no complicated adjustment is required. Therefore, according to the semiconductor light-emitting device shown in FIG. 15, a device can be provided at a lower cost.

In addition, according to the semiconductor light-emitting device shown in FIG. 15, since each device can be formed in a smaller area than in the prior art, a plurality of devices can be simultaneously formed on a single substrate. Therefore, when semiconductor light-emitting device chips are to be obtained by cutting them out, more chips can be obtained. In this regard as well, devices can be provided at a lower cost owing to so-called volume efficiency. In addition, since thin devices can be formed, they can be mounted in smaller apparatuses.

[Ninth Embodiment]

Still another embodiment of the present invention will be described next.

Figure 16:
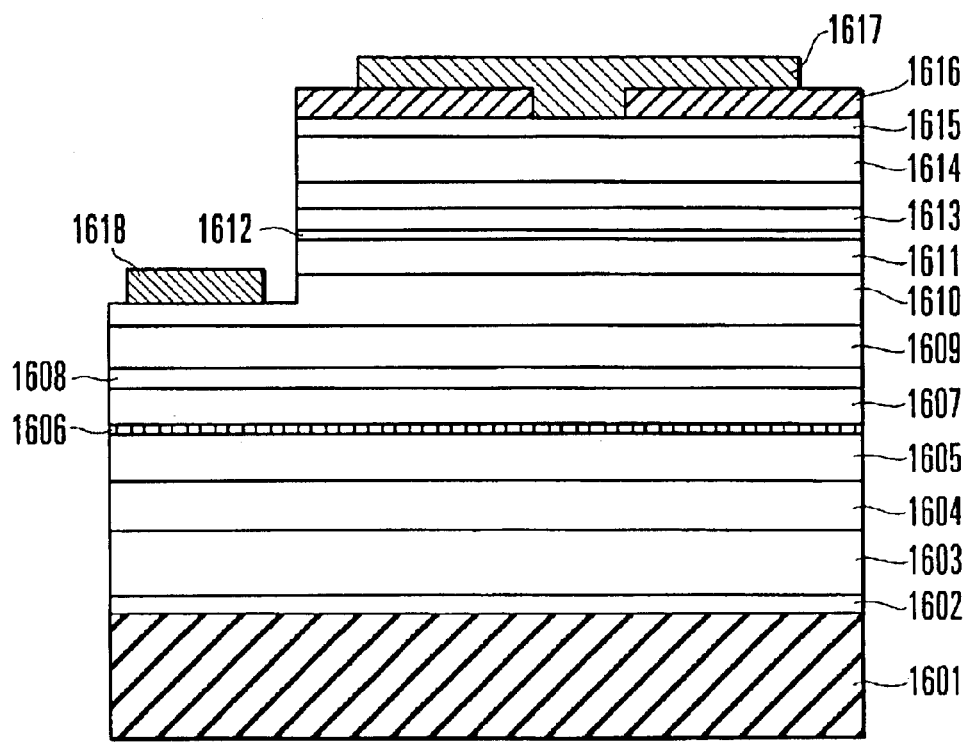
FIG. 16 is a sectional view schematically showing an example of the arrangement of a semiconductor light-emitting device according to still another embodiment of the present invention.

FIG. 16 shows an example of the arrangement of a semiconductor light-emitting device according to this embodiment. This semiconductor light-emitting device is a white light-emitting diode having three light-emitting layers. FIG. 16 shows a cross-sectional view of this device in a direction of thickness in crystal growth.

This light-emitting diode includes the following layers on the surface of a 330-$\mu$m thick single-crystal substrate 1601 made of (0001)-oriented sapphire (single-crystal a-$Al_2O_3$): a 20-nm thick buffer layer 1602 made of GaN and a 1-$\mu$m thick semiconductor layer 1603 made of GaN. Note that the single-crystal substrate 1601 is not limited to sapphire. For example, this substrate may be made of a crystal such as silicon carbide (SiC), zinc oxide (ZnO), or lithium gallate ($LiGaO_2$).

The following layers are formed on the semiconductor layer 1603: a 1-$\mu$m thick cladding layer 1604 made of AlGaN, a barrier layer 1605 made of InGaAlN, and a lower active layer 1606 formed from a layer having a structure in which a plurality of island portions made of InN are arrayed in the same plane. For example, each of the plurality of island portions forming the lower active layer 1606 is formed to have a diameter of about 10 nm and a height of about 3 nm, like the island portions 1405a in FIG. 14B. By setting the size of each island portion 1405a to be equal to or smaller than the spread of the wave function of an electron in this manner, a quantum effect can be obtained. The emission wavelength of the semiconductor light-emitting device based on the lower active layer 1606 is almost determined by the size of each island portion. Note that the size of each island portion 1405a is not limited to be equal to or smaller than the spread of the wave function of an electron, and may be larger.

Note that the shape of each island portion is not limited to a semispherical shape. For example, the island portions may have a cylindrical, prism, pyramid, or cone shape. In addition, the island portions may be arrayed at equal intervals or may be arranged at nonuniform intervals. In addition, the respective island portions may be formed to be completely isolated from each other or to be connected to each other through thin InN films forming the island portions. Note that the respective island portions are formed to have almost the same size.

The lower active layer 1606 formed from a plurality of island portions formed in the above manner is covered with a barrier layer 1607 made of InGaAlN. An intermediate active layer 1608 which is made of $In_YGa_{1-Y}N$ and serves as a quantum well and a barrier layer 1609 made of InGaAlN are formed on the barrier layer 1607.

An electrode layer 1610 made of Si-doped n-type GaN is formed on the barrier layer 1609. A barrier layer 1611 made of Si-doped n-type InGaAlN is formed on the electrode layer 1610. An upper active layer 1612 which is made of $In_XGa_{1-X}N$ and serves as a quantum well is formed on the barrier layer 1611. Note that in the intermediate active layer 1608 and upper active layer 1612, X<Y.

A barrier layer 1613 made of Mg-doped p-type InGaAlN is formed on the upper active layer 1612. A 0.5-$\mu$m thick cladding layer 1614 made of Mg-doped p-type $Al_{0.1}Ga_{0.9}N$ and a 0.1-$\mu$m thick contact layer 1615 made of Mg-doped p-type GaN are formed on the barrier layer 1613.

A current limiting insulating layer 1616 which is made of $SiO_2$ and has a substantially circular opening window with a diameter of about 20 $\mu$m is formed on the contact layer 1615. A p-type metal electrode 1617 which is in contact with the contact layer 1615 through the opening window is formed on the current limiting insulating layer 1616. Although not shown, the p-type metal electrode 1617 has a multilayer structure constituted by a 50-nm thick palladium layer in direct contact with the contact layer 1615, a 30-nm thick platinum layer formed thereon, and a 200-nm thick gold layer formed thereon.

Note that the electrode layer 1610 has an exposed region formed by partly etching the respective layers formed thereon, and an n-type metal electrode 1618 is formed in this exposed region. Although not shown, the n-type metal electrode 1618 has a multilayer structure constituted by a 50-nm thick titanium layer in direct contact with the exposed region, a 30-nm thick platinum layer, and a 200-nm thick gold layer. The above semiconductor light-emitting device can be manufactured by the same method as that for the semiconductor light-emitting device of the embodiment shown in FIG. 14A.

In the semiconductor light-emitting device according to this embodiment which has the above arrangement, the first light-emitting structure is formed by the barrier layer 1605, lower active layer 1606, and barrier layer 1607. The second light-emitting structure is formed by the barrier layer 1607, intermediate active layer 1608, and barrier layer 1609. The third light-emitting structure is formed by the barrier layer 1611, upper active layer 1612, and barrier layer 1613.

The emission wavelengths of the respective light-emitting structures are set by controlling the compositions and thicknesses of the respective active layers such that the first light-emitting structure has the longest emission wavelength and the third light-emitting structure has the shortest emission wavelength. That is, the farther to the single-crystal substrate 1601, the light-emitting structures are located, the shorter the emission wavelengths become (the larger the bandgaps become). Therefore, light emitted from the third light-emitting structure upon current injection is partly absorbed by the second and first light-emitting structures, and the remaining part which is not absorbed emerges from the lower surface of the single-crystal substrate 1601.

The second light-emitting structure is excited by the light emitted from the third light-emitting structure absorbed in the second light-emitting structure. As a result, a light emission with a wavelength unique to the second light-emitting structure is produced. Part of the light emission produced by the second light-emitting structure is absorbed in the first light-emitting structure, and the remaining part which is not absorbed in the first light-emitting structure emerges from the single-crystal substrate 1601. Lastly, the first light-emitting structure absorbs the light from the third and second light-emitting structures. The first light-emitting structure is excited by the absorbed light to produce light emission with a wavelength unique to the first light-emitting structure. This light also emerges from the lower surface of the single-crystal substrate 1601.

As described above, in this semiconductor light-emitting device in FIG. 16 as well, a highly efficient white light emission can be obtained with little loss by designing the stacking order of the first to third light-emitting structures in consideration of the positional relationship with respect to the single-crystal substrate 1601 serving as a light extraction window. Proper designing of the first to third light-emitting structures can obtain light emissions in a wide wavelength range including the infrared, visible, and ultraviolet regions. Note that the relationship in emission wavelength among the respective light-emitting structures is not limited to that described above. For example, the second light-emitting structure may have the longest emission wavelength.

When, for example, a current is supplied to the resultant device having the p-type metal electrode 1617 as an anode and the n-type metal electrode 1618 as a cathode, bluish white light emerging from the lower surface of the single-crystal substrate 1601 is observed. The color of light emission obtained from this semiconductor light-emitting device can be changed by controlling the structure factors of each active layer, i.e., the composition and thickness of each layer, the diameter of each island portion, and the composition and thickness of a crystal layer (barrier layer) around each region.

In the semiconductor light-emitting device in FIG. 16, the three active layers are stacked on each other through the barrier layers. However, the present invention is not limited to this. By properly setting the compositions of crystals forming the respective active layers and the thicknesses of the layers, and designing emission colors of the respective layers, light emission near white can be obtained even by a semiconductor light-emitting device having two active layers stacked on each other through a barrier layer.

In addition, the intermediate active layer 1608 and upper active layer 1612 may be formed from a plurality of island portions made of InGaN or InN.

A manufacturing method will be described next. An equipment of metalorganic vapor phase epitaxy having a vertical-type reactor is used for crystal growth for the formation of each crystal layer. As a nitrogen source, ammonia is used. Note that as a carrier gas, hydrogen gas is used unless otherwise specified. The growth pressure is set to atmospheric pressure.

First of all, the substrate temperature is set at 1,050° C., and the surface of the single-crystal substrate 1601 made of sapphire is nitrided in an ammonia atmosphere. Thereafter, the substrate temperature is set at 550° C., and the buffer layer 1602 is formed by growing GaN. In the growth of this GaN, triethylgallium (TEG) is used as a gallium source, which has a low vapor pressure, is suited to supply of a small amount of Ga, readily decomposes at a low temperature of 550° C., and allows no carbon which is a constituent element of the source to be taken in the grown layer. Subsequently, the single-crystal substrate 1601 is annealed at 1,050° C. for 9 min to form the buffer layer 1602 into a single crystal.

The temperature of the single-crystal substrate is then set at 1,020° C., and GaN and $Al_{0.1}Ga_{0.9}N$ are sequentially grown to form the semiconductor layer 1603 and cladding layer 1604. As an aluminum source for the vapor phase growth of these layers, trimethylaluminum (TMA) is used. As a gallium source, trimethylgallium (TMG) is used, which has a relatively high vapor pressure.

InGaAlN, $In_xGa_{1-x}N$, InGaAlN, $In_yGa_{1-y}N$, InGaAlN, Si-doped n-type GaN, and Si-doped n-type InGaAln are continuously grown on the cladding layer 1604 to form the barrier layer 1605, lower active layer 1606, barrier layer 1607, intermediate active layer 1608, barrier layer 1609, electrode layer 1610, and barrier layer 1611.

In forming the lower active layer 1606, InN is grown in the form of islands to form a plurality of island portions. In forming the island portions, first of all, InN is grown in the form of a film or in a film-like state on the barrier layer 1605. In the growth of InN, since the equilibrium vapor pressure of nitrogen on the solid phase of InN is high, the substrate temperature is set at 500° C. In addition, in this vapor phase growth, trimethylindium (TMI) is used as an indium source. In this growth process, in order to grow high-quality InN by preventing precipitation of metal In, the ratio of ammonia to TMI, i.e., V/III, is set to 660,000. Nitrogen is used both as a carrier gas and a bubbling gas.

After InN is grown in the form of a film in the above manner, this film is heated in a nitrogen atmosphere at 700° C. for 20 min. The film-like InN layer is formed into the plurality of island portions by this heating.

In the crystal growth of each layer containing indium, since the equilibrium vapor pressure of nitrogen on the solid phase of InN is high, the growth temperature (substrate temperature) is set at about 550° C. As an indium source, trimethylindium (TMI) is used. As a Ga source in the growth of each layer containing indium, TEG is used. This is because TEG decomposes at a low temperature and has a low vapor pressure, and hence is suitable for composition control on a crystal layer as compared with TMG.

In the crystal growth of each layer described above, in order to grow high-quality InN by preventing precipitation of metal In, the ratio of ammonia to (TMI+TMA+TEG), i.e., V/III, is set to 660,000. Nitrogen is used both as a carrier gas and a bubbling gas. This is because the use of hydrogen as a carrier gas will suppress the decomposition of ammonia (reference 7). Silane ($SiH_4$) gas which is diluted with hydrogen and has a concentration of 1 ppm is used to dope each layer with Si.

The upper active layer 1612 is then formed on the barrier layer 1611. Mg-doped p-type InGaAlN is grown on the upper active layer 1612 to form the barrier layer 1613 so as to cover the island portions.

After the barrier layer 1613 is formed, Mg-doped p-type $Al_{0.1}Ga_{0.9}N$ and Mg-doped p-type GaN are sequentially grown to form the cladding layer 1614 and contact layer 1615. As a source for Mg doping, bis(methylcyclopentadienyl)magnesium is used. This source is a liquid, which is advantageous in reproducibility of the doping concentration of Mg over bis(cyclopentadienyl)magnesium which is a generally used solid source.

After the barrier layer 1613, cladding layer 1614, and contact layer 1615 are formed, the resultant structure is annealed in a nitrogen atmosphere at 700° C. for 30 min to activate Mg added to these layers.

After the respective crystal layers described above are formed, the current limiting insulating layer 1615 made of $SiO_2$ is formed on the contact layer 1615 by using an RF magnetron sputter apparatus, and an opening window is formed in the current limiting insulating layer 1616 by the known photolithography technique and etching technique.

After the opening window is formed in the current limiting insulating layer 1616, a 50-nm thick nickel film and a 100-nm thick gold film are sequentially deposited and stacked on the current limiting insulating layer 1616 including the opening window by using an electron beam deposition apparatus, thereby forming a metal layer serving as the p-type metal electrode 1617. Thereafter, a novolac-based positive photoresist pattern is formed on the metal layer by the known photolithography technique, and the underlayer is etched by using this pattern as a mask to form an exposed region on the electrode layer 1610. In this etching, for example, etching of the crystal layer, is performed by reactive ion etching using chlorine gas.

After etching for the formation of the above exposed region, removal of the photoresist pattern, and cleaning of the single-crystal substrate 1601 and the structure formed thereon, a 50-nm thick aluminum film and a 200-nm thick gold film are sequentially deposited on the exposed region of the electrode layer 1610, and the resultant structure is patterned to form the n-type metal electrode 1618.

After the manufacturing process is completed up to the formation of the n-type metal electrode 1611 in the manner described above, the single-crystal substrate 1601 is polished and thinned to a mirror surface. The resultant structure is cleaned, and the single-crystal substrate 1601 is cut in a predetermined size by using a diamond scriber, thereby extracting a device. The device size is set to about 500 $\mu$m square.

When a current is supplied to the extracted device having the p-type metal electrode 1617 as an anode and the n-type metal electrode 1618 as a cathode to make the device operate, a light emission can be obtained from the lower surface of the single-crystal substrate 1601. For example, the obtained light emission is bluish white light. As described above, the light emission obtained by this embodiment is bluish white. However, an emission color with a desired characteristic can be obtained by properly controlling the composition of a crystal layer forming an active layer and the thickness of the active layer.

In the semiconductor light-emitting device in FIG. 16, the three active layers are stacked on each other through the barrier layers. However, the present invention is not limited to this. By properly setting the compositions of crystals forming the respective active layers and the thicknesses of the layers, and designing emission colors of the respective layers, light emission near white can be obtained even by a semiconductor light-emitting device having two active layers stacked on each other through a barrier layer.

[10th Embodiment]

Still another embodiment of the present invention will be described next.

Figure 17A:
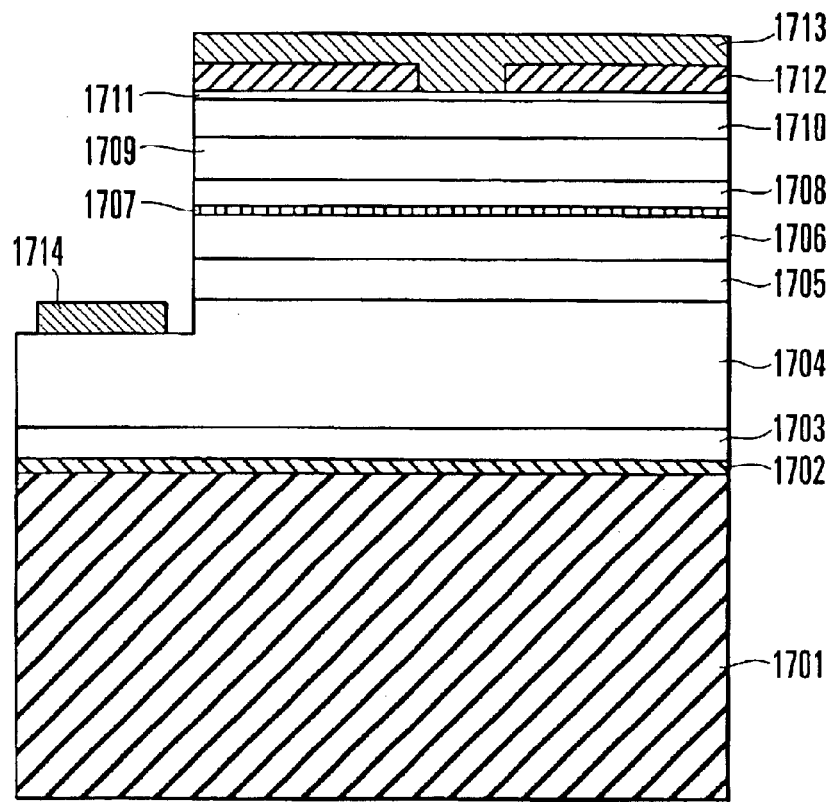
FIG. 17A is a sectional view schematically showing an example of the arrangement of a semiconductor light-emitting device according to still another embodiment of the present invention.
Figure 17B:
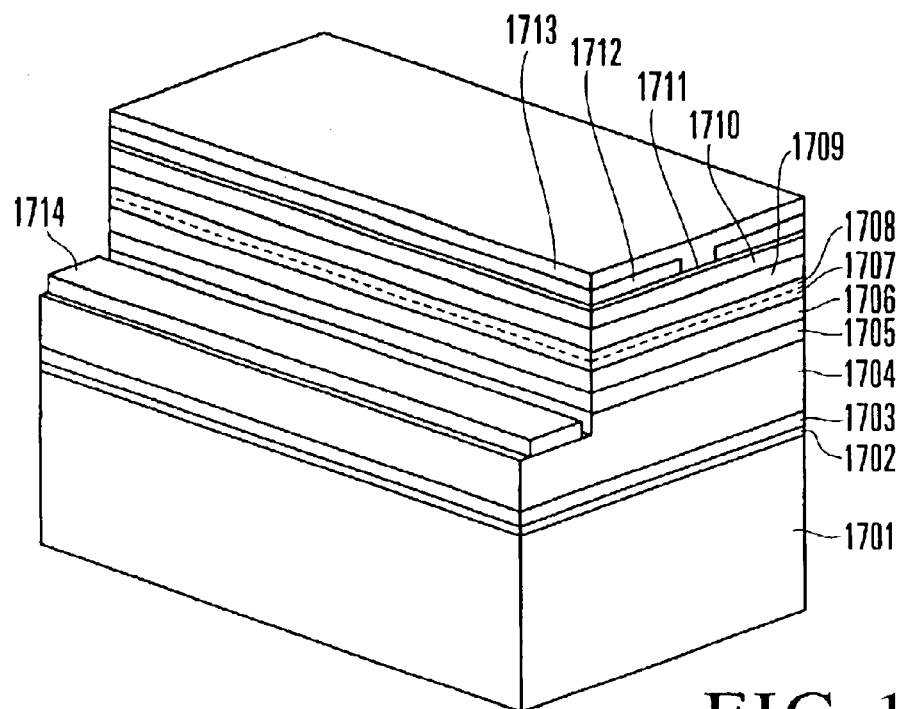
FIG. 17B is a perspective view schematically showing an example of the arrangement of the semiconductor light-emitting device according to still another embodiment of the present invention.

FIGS. 17A and 17B show an example of the arrangement of a semiconductor light-emitting device according to this embodiment. FIG. 17A shows a cross-sectional view of a semiconductor laser with an oscillation wavelength of 0.4 $\mu$m or more, as an example, in a direction in which guided light propagates back and forth in the cavity, i.e., along a direction perpendicular to the axis of the cavity.

This semiconductor laser includes the following layers on the surface of a 330-$\mu$m thick single-crystal substrate 1701 made of (0001)-oriented sapphire (single-crystal $Al_2O_3$): a 20-nm thick buffer layer 1703 made of GaN formed through a nitride layer 1702 with a nitridation depth of 1.2 nm, a 4-$\mu$m thick electrode layer 1704 made of Si-doped n-type GaN, and a 0.5-$\mu$m thick cladding layer 1705 made of Si-doped n-type $Al_{0.1}Ga_{0.9}N$. Note that the single-crystal substrate 1701 is not limited to sapphire. For example, this substrate may be made of a crystal such as silicon carbide (SiC), zinc oxide (ZnO), or lithium gallate ($LiGaO_2$).

A 0.6-$\mu$m thick guiding layer 1706 made of Si-doped n-type GaN is formed on a cladding layer 1705. An active layer 1707 formed from a layer having a structure in which a plurality of island portion made of InN are arrayed in the same plane is formed on the guiding layer 1706. For example, each of the plurality of island portions forming the active layer 1707 is formed to have a diameter of about 2 nm and a height of about 1 nm, like, for example, the island portions 1405a shown in FIG. 14B. By setting the size of each island portion to be equal to or smaller than the spread of the wave function of an electron in this manner, a quantum effect can be obtained. The emission wavelength of the semiconductor light-emitting device based on the active layer 1707 is almost determined by the size of each island portion. Note that the size of each island portion is not limited to be equal to or smaller than the spread of the wave function of an electron, and may be larger.

Note that the shape of each island portion is not limited to a semispherical shape. For example, the island portions may have a cylindrical, prism, pyramid or cone shape. In addition, the island portions may be arrayed at equal intervals or may be arranged at nonuniform intervals. In addition, the respective island portions may be formed to be completely isolated from each other or to be connected to each other through thin InN films forming the island portions. Note that the respective island portions are formed to have almost the same size.

As described above, the following layers are formed on the active layer 1707 formed in the above manner: a 10-nm thick growth cover layer 1708 made of undoped GaN, a 0.55-$\mu$m thick guiding layer 1709 made of Mg-doped p-type GaN, a 0.5-$\mu$m thick cladding layer 1710 made of Mg-doped p-type $Al_{0.1}Ga_{0.9}N$, and a 0.1-$\mu$m thick contact layer 1711 made of Mg-doped p-type GaN.

A current limiting insulating layer 1711 which is made of $SiO_2$ and has a groove with a width of about 2 $\mu$m to limit a current injection region is formed on the contact layer 1711. Note that the above groove is formed parallel to the reciprocating direction of light in the cavity of this semiconductor laser. A p-type metal electrode 1713 which is in contact with the contact layer 1711 through the above groove is formed on the current limiting insulating layer 1712. Although not shown, the p-type metal electrode 1713 has a multilayer structure constituted by a 50-nm thick palladium layer in direct contact with the contact layer 1711, a 30-nm thick platinum layer formed on the palladium layer, and a 200-nm thick gold layer formed on the platinum layer. These metal layers are patterned by using the lift-off technique.

Note that the electrode layer 1704 has an exposed region formed by partly etching the respective layers formed thereon, and an n-type metal electrode 1714 in this exposed region. Although not shown, the n-type metal electrode 1714 has a multilayer structure constituted by a 50-nm thick titanium layer in direct contact with the exposed region, a 30-nm thick platinum layer, and a 200-nm thick gold layer. The cavity length of the semiconductor laser shown in FIG. 17 is about 500 $\mu$m.

Figure 18:
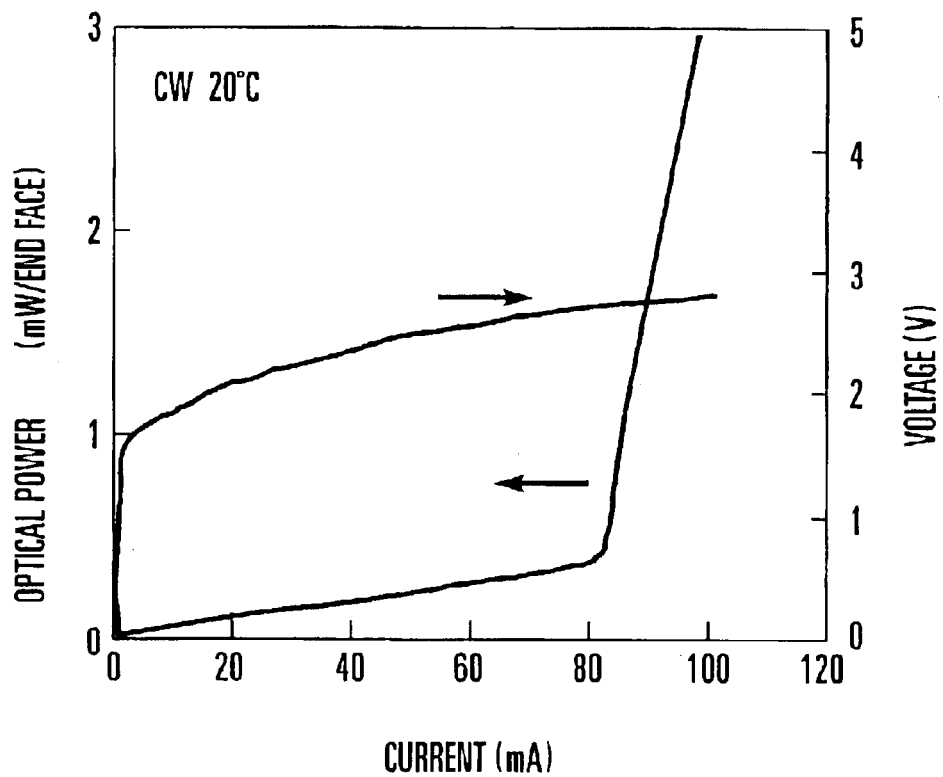
FIG. 18 is a graph showing the characteristics of the semiconductor light-emitting device in FIG. 17A.
Figure 19:
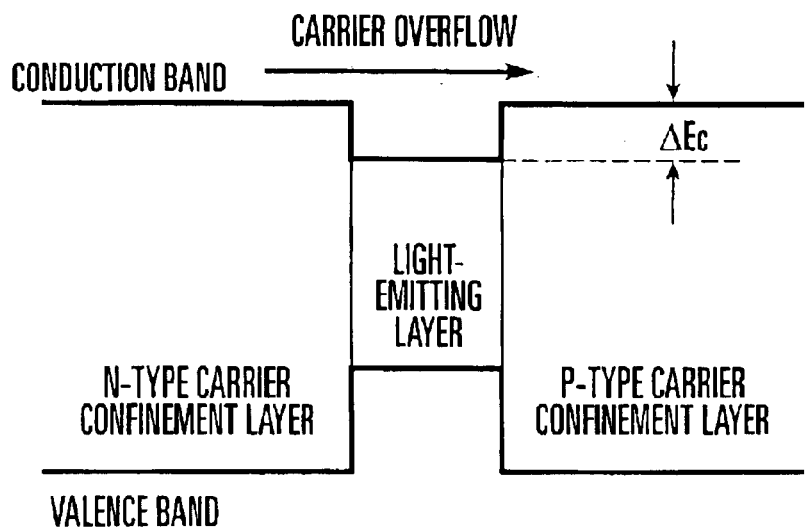
FIG. 19 is a schematic bend structure for explaining a carrier overflow.

FIG. 18 shows an optical power/current characteristic (CW characteristic) and voltage/current characteristic obtained as results of measuring the semiconductor laser in FIG. 17, mounted junction up on a heat sink, at room temperature by using a DC current. The semiconductor laser shown in FIG. 17 caused CW oscillation at room temperature with a threshold current of 80 mA. The resultant oscillation wavelength was 1.60 µm. The operating voltage at this time was 2.7 V. A built-in voltage $V_b$ was about 1.5 V.

When $In_{1-X}Ga_XN$ (0<X<0.4) is used for a light-emitting structure including an active layer as in the prior art, the built-in voltage $V_b$ is a little less than 4 V. In comparison with this, the built-in voltage of the semiconductor laser shown in FIG. 17 is low because InN with a small bandgap is used for the active layer 1707. Note that the semiconductor laser in FIG. 17 exemplifies the laser using InN for the active layer 1707. However, $In_{1-X-Y}Ga_XAl_YN$ ($0 \leq X$, $Y \leq 1$, $0 \leq X+Y<1$) having a larger bandgap than InN may be used for an active layer. In this case, the oscillation wavelength can be further decreased to, for example, 0.4 µm.

In this embodiment as well, the active layer 1707 may have a structure in which a layer constituted by a plurality of island portions and a growth cover layer (barrier layer) are stacked on each other.

As has been described above, the semiconductor light-emitting device according to the present invention includes at least the first cladding layer formed on the substrate, the light-emitting structure which is made of $In_{1-X-Y}Ga_XAl_YN$ ($0 \leq X$, $Y \leq 1$, $0 \leq X+Y<1$) and formed on the first cladding layer, and the second cladding layer formed on the light-emitting structure.

As a result of this arrangement, in the semiconductor light-emitting device of the present invention, the active layer is formed from a material with a small Auger effect. In addition, the semiconductor light-emitting device of the present invention has the layer arrangement that allows to have a large ΔEc. As a consequence, the semiconductor light-emitting device of the present invention is robust against changes in temperature in an operating environment, and can perform high-power operation.

What is claimed is:

1. A semiconductor light-emitting device comprising at least:
   a first cladding layer formed on a substrate;
   a light-emitting structure including an active layer made of $In_{1-X-Y}Ga_XAl_YN$ ($0 \leq X$, $Y \leq 1$, $0 \leq X+Y<1$) and formed on said first cladding layer; and
   a second cladding layer formed on said light-emitting structure,
   wherein light whose wavelength is longer than 0.65 µm (=energy bandgap 1.9 eV) and shorter than 1.65 µm (=energy bandgap 0.75 eV) is emitted from said light-emitting structure.

2. A device according to claim 1, further comprising first and second semiconductor layers formed to sandwich the active layer, said first and second semiconductor layers being made of $In_{1-X'-Y'}Ga_{X'}Al_{Y'}N$ ($0 \leq X'$, $Y' \leq 1$, $0 \leq X'+Y' \leq 1$) and $In_{1-X''-Y''}Ga_{X''}Al_{Y''}N$ ($0 \leq X''$, $Y'' \leq 1$, $0 \leq X''+Y'' \leq 1$).

3. A device according to claim 1, wherein
   said light-emitting structure is constituted by a first light-emitting structure and a second light-emitting structure formed thereon,
   the first light-emitting structure is formed from a first active layer sandwiched between barrier layers,
   the second light-emitting structure is formed from a second active layer sandwiched between barrier layers, and
   the first and second light-emitting structures have different emission wavelengths.

4. A device according to claim 3, wherein the first and second semiconductor light-emitting elements are made of $In_{1-X-Y}Ga_XAl_YN$ ($0 \leq X$, $Y \leq 1$, $0 \leq X+Y<1$) with different composition ratios.

5. A device according to claim 4, wherein the barrier layers are made of $In_{1-X-Y}Ga_XAl_YN$ ($0 \leq X$, $Y \leq 1$, $0 \leq X+Y \leq 1$) having higher bandgap energy than the first and second active layers.

6. A device according to claim 3, wherein the first and second light-emitting structures are made of $In_{1-X-Y}Ga_XAl_YN$ ($0 \leq X$, $Y \leq 1$, $0 \leq X+Y<1$) with different film thicknesses.

7. A device according to claim 6, wherein the barrier layers are made of $In_{1-X-Y}Ga_XAl_YN$ ($0 \leq X$, $Y \leq 1$, $0 \leq X+Y \leq 1$) having higher bandgap energy than the first and second active layers.

8. A device according to claim 1, wherein
   said light-emitting structure is constituted by a first light-emitting structure, a second light-emitting structure formed thereon, and a third light-emitting structure formed thereon,
   the first light-emitting structure is formed from a first active layer sandwiched between barrier layers,
   the second light-emitting structure is formed from a second active layer sandwiched between barrier layers,
   the third light-emitting structure is formed from a third active layer sandwiched between barrier layers, and
   the first, second, and third light-emitting structures have different emission wavelengths.

9. A device according to claim 8, wherein the first, second, and third semiconductor light-emitting elements are made of $In_{1-X-Y}Ga_XAl_YN$ ($0 \leq X$, $Y \leq 1$, $0 \leq X+Y<1$) with different composition ratios.

10. A device according to claim 9, wherein the barrier layers are made of $In_{1-X-Y}Ga_XAl_YN$ ($0 \leq X$, $Y \leq 1$, $0 \leq X+Y \leq 1$) having higher bandgap energy than the first to third active layers.

11. A device according to claim 8, wherein the first, second, and third semiconductor light-emitting elements are made of $In_{1-X-Y}Ga_XAl_YN$ ($0 \leq X$, $Y \leq 1$, $0 \leq X+Y<1$) with different film thicknesses.

12. A device according to claim 11, wherein the barrier layers are made of $In_{1-X-Y}Ga_XAl_YN$ ($0 \leq X$, $Y \leq 1$, $0 \leq X+Y \leq 1$) having higher bandgap energy than the first to third active layers.

13. A device according to claim 1, wherein
   said light-emitting structure is constituted by a first light-emitting structure, a second light-emitting structure, a second light-emitting structure, and a third light-emitting structure arrayed on the substrate,
   the first light-emitting structure is formed from a first active layer sandwiched between barrier layers,
   the second light-emitting structure is formed from a second active layer sandwiched between barrier layers,
   the third light-emitting structure is formed from a third active layer sandwiched between barrier layers, and
   the first, second, and third light-emitting structures have different emission wavelengths.

14. A device according to claim 13, wherein the first, second, and third semiconductor light-emitting elements are made of $In_{1-X-Y}Ga_XAl_YN$ ($0 \leq X$, $Y \leq 1$, $0 \leq X+Y<1$) with different composition ratios.

15. A device according to claim 14, wherein the barrier layers are made of $In_{1-X-Y}Ga_XAl_YN$ ($0 \leq X$, $Y \leq 1$, $0 \leq X+Y \leq 1$) having higher bandgap energy than the first to third active layers.

16. A device according to claim 13, wherein the first, second, and third light-emitting structures are made of $In_{1-X-Y}Ga_XAl_YN$ ($0 \leq X$, $Y \leq 1$, $0 \leq X+Y<1$) with different film thicknesses.

17. A device according to claim 16, wherein the barrier layers are made of $In_{1-X-Y}Ga_XAl_YN$ ($0 \leq X$, $Y \leq 1$, $0 \leq X+Y \leq 1$) having higher bandgap energy than the first to third active layers.

18. A device according to claim 1, wherein the active layer is formed from a layer constituted by a plurality of island portions arrayed in the same plane, and the island portions are made of $In_{1-X-Y}Ga_XAl_YN$ ($0 \leq X$, $Y \leq 1$, $0 \leq X+Y<1$).

19. A device according to claim 18, wherein the respective island portions are so arrayed as to be isolated from each other.

20. A device according to claim 18, wherein the layer constituted by the plurality of island portions arrayed in the same plane is covered with a barrier layer made of $In_{1-X-Y}Ga_XAl_YN$ ($0 \leq X$, $Y \leq 1$, $0 \leq X+Y \leq 1$) having higher bandgap energy than the island portions.

21. A device according to claim 20, wherein the active layer comprises a multilayer structure formed by stacking the layer constituted by the plurality of island portions arrayed in the same plane and the barrier layer.

22. A device according to claim 18, wherein the island portions are made of InN.

* * * * *

UNITED STATES PATENT AND TRADEMARK OFFICE
CERTIFICATE OF CORRECTION

PATENT NO. : 6,927,426 B2
APPLICATION NO. : 10/426464
DATED : August 9, 2005
INVENTOR(S) : Matsuoka et al.

It is certified that error appears in the above-identified patent and that said Letters Patent is hereby corrected as shown below:

Title Page 2
In Item [56], Other Publications, Col. 2, Line 6, please delete "994" and insert -- 944 --.

Title Page 2
In item [56], Other Publications, Col. 2, Line 7, please delete "Kight" and insert -- Light --.

Col. 42, Line #2, please delete "semiconductor".

Col. 42, Line #2, please delete "elements" and insert -- structures --.

Col. 42, Line #31, please delete "semiconductor".

Col. 42, Line #31, please delete "elements" and insert -- structures --.

Col. 42, Line #65, please delete "semiconductor".

Col. 42, Line #65, please delete "elements" and insert -- structures --.

Col. 43, Line #6, please delete "structuresare" and insert -- structures are --.

Signed and Sealed this

Twentieth Day of November, 2007

JON W. DUDAS
*Director of the United States Patent and Trademark Office*